(12) United States Patent
Kim et al.

(10) Patent No.: US 12,477,872 B2
(45) Date of Patent: Nov. 18, 2025

(54) DISPLAY DEVICE AND METHOD FOR MANUFACTURING THE SAME

(71) Applicant: Samsung Display Co., LTD., Yongin-si (KR)

(72) Inventors: Sang Jo Kim, Yongin-si (KR); Byung Ju Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 351 days.

(21) Appl. No.: 18/207,071

(22) Filed: Jun. 7, 2023

(65) Prior Publication Data

US 2024/0063346 A1 Feb. 22, 2024

(30) Foreign Application Priority Data

Aug. 16, 2022 (KR) .......................... 10-2022-0102083

(51) Int. Cl.
*H10H 20/851* (2025.01)
*H01L 25/075* (2006.01)
(Continued)

(52) U.S. Cl.
CPC ..... *H10H 20/8513* (2025.01); *H01L 25/0753* (2013.01); *H10H 20/8252* (2025.01);
(Continued)

(58) Field of Classification Search
CPC ........... H10H 20/8513; H10H 20/8252; H10H 20/8312; H10H 20/0361; H10H 20/032; H01L 25/0753
See application file for complete search history.

(56) References Cited

U.S. PATENT DOCUMENTS 11,756,937 B2 * 9/2023 Takeya ................ H10H 20/856
257/89
2010/0320443 A1 12/2010 Jiang et al.
(Continued)

FOREIGN PATENT DOCUMENTS

KR 10-2021-0081761 A 7/2021

OTHER PUBLICATIONS

Damilano, B. et al., "Blue-green and white color tuning of monolithic light emitting diodes", Journal of Applied Physics 108, 073115 (2010); doi: 10.1063/1.3490895 (7 pages).
(Continued)

*Primary Examiner* — Anne M Hines
(74) *Attorney, Agent, or Firm* — Womble Bond Dickinson (US) LLP

(57) ABSTRACT

A display device comprises a substrate, and a first light emitting element, a second light emitting element, and a third light emitting element provided on the substrate and each including a first semiconductor layer, an active layer, and a second semiconductor layer. A third semiconductor layer is provided on the first light emitting element, a first color conversion layer is provided on the second light emitting element, and a second color conversion layer is provided on the third light emitting element, wherein the first color conversion layer and the second color conversion layer include the same semiconductor material as the third semiconductor layer, and further include dopants different from that of the second semiconductor layer.

20 Claims, 37 Drawing Sheets

(51) Int. Cl.
*H10H 20/825* (2025.01)
*H10H 20/831* (2025.01)
*H10H 20/01* (2025.01)

(52) U.S. Cl.
CPC ....... *H10H 20/8312* (2025.01); *H10H 20/032* (2025.01); *H10H 20/0361* (2025.01)

(56) References Cited

U.S. PATENT DOCUMENTS

| | | | |
|---|---|---|---|
| 2023/0187581 A1* | 6/2023 | Yeo | H01L 25/0753 257/79 |
| 2023/0215903 A1* | 7/2023 | Jeon | H01L 25/0756 257/91 |

OTHER PUBLICATIONS

Van Der Gon, D. Denier et al., "Size dependence of quantum efficiency of red emission from GaN:Eu structures for application in micro-LEDs", Optics Letters 45:14 (2020), pp. 3973-3976 (4 pages).

\* cited by examiner

FIG. 3
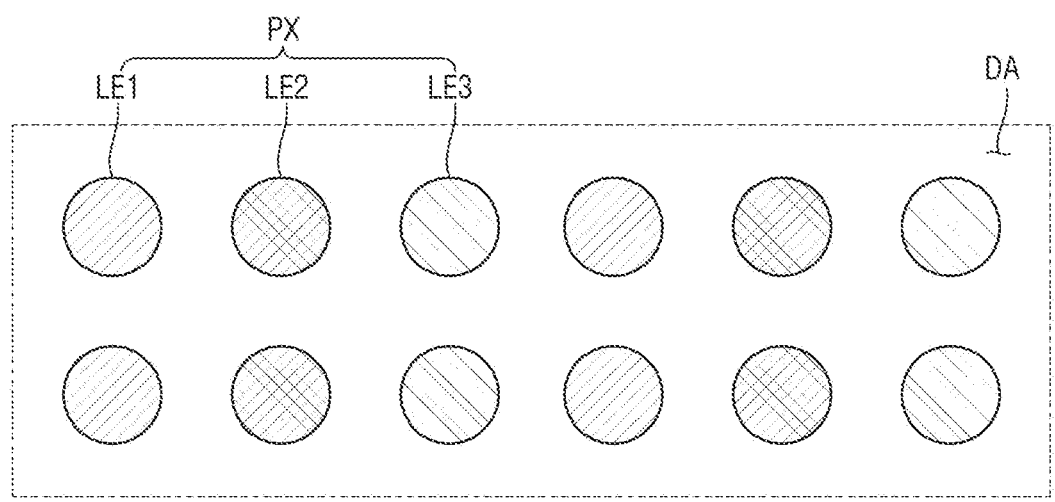
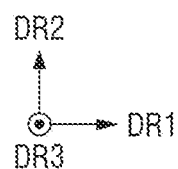

FIG. 16
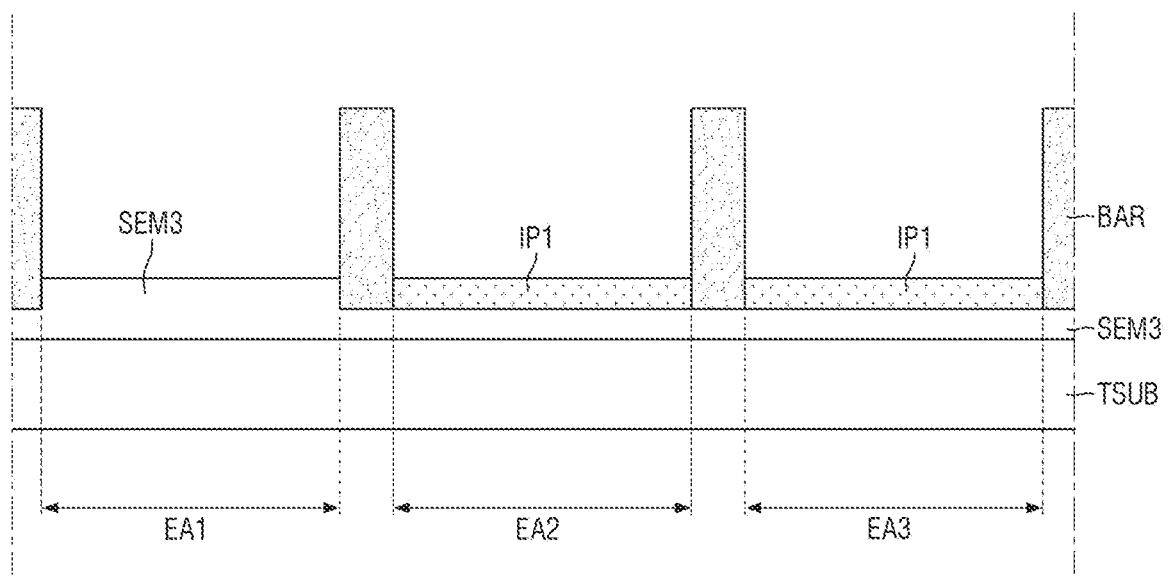
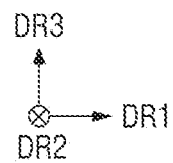

FIG. 28
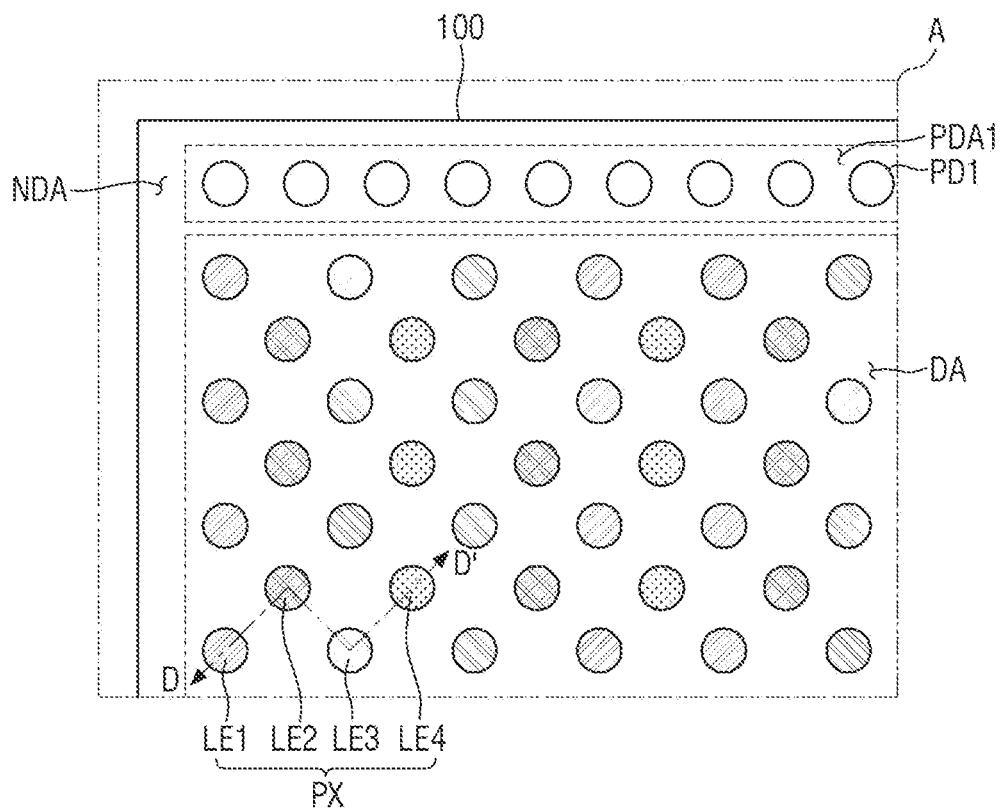
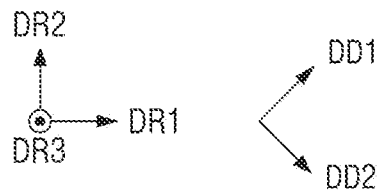

FIG. 29
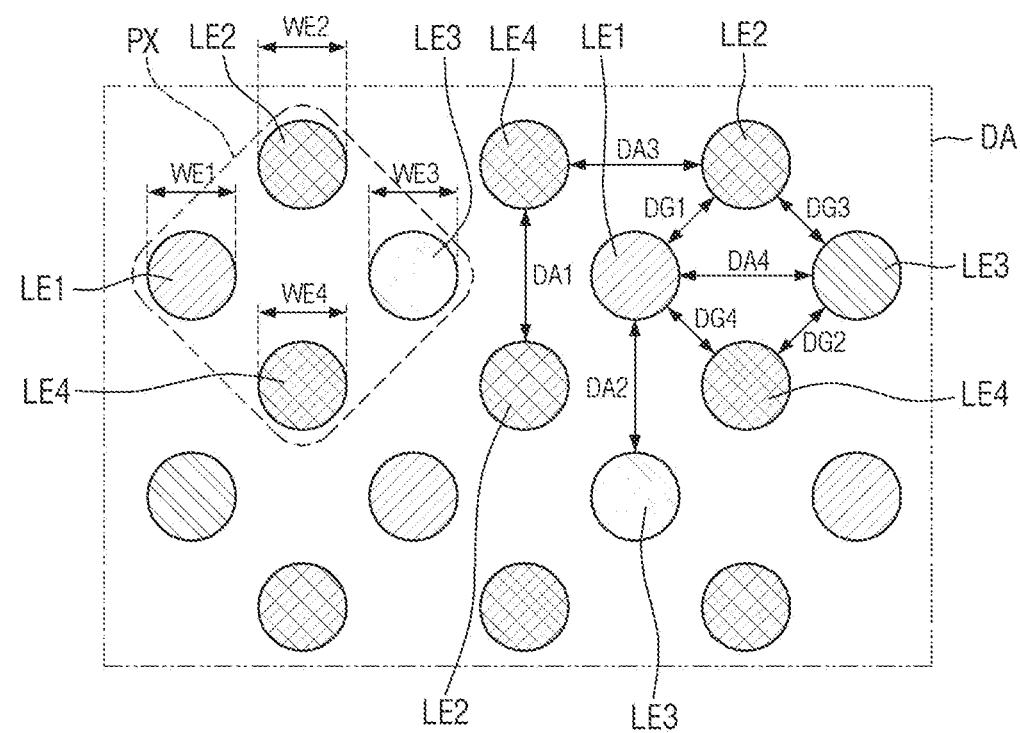
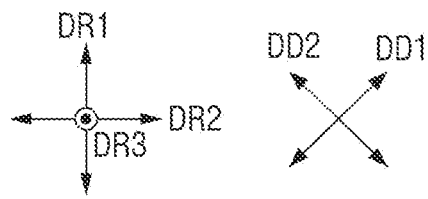

FIG. 30
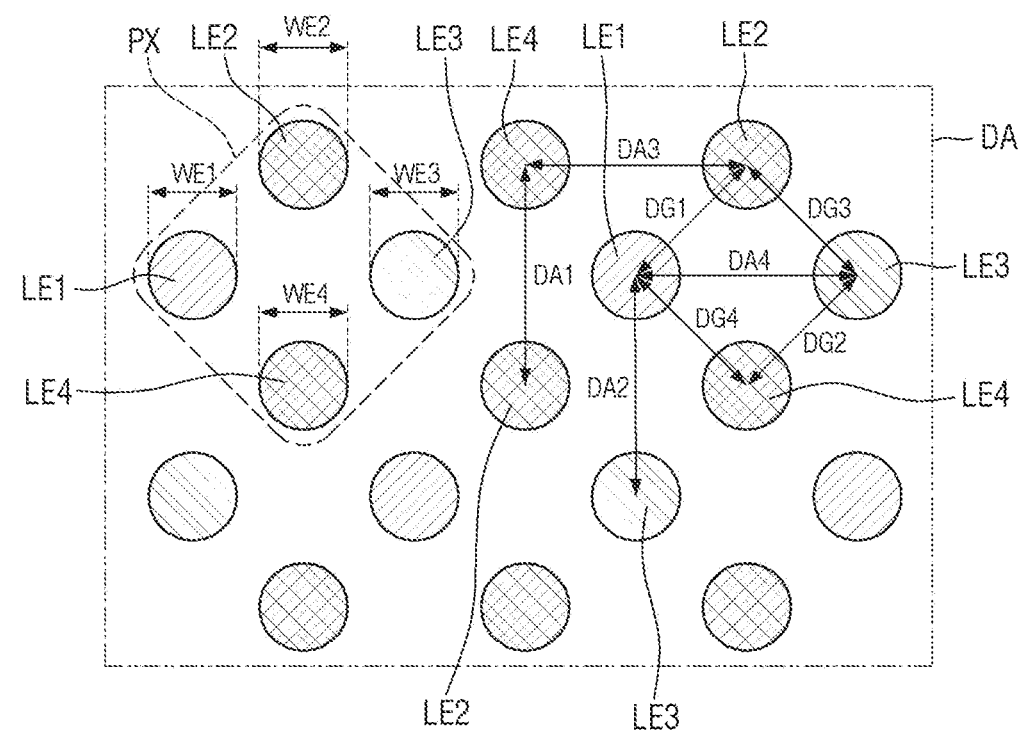
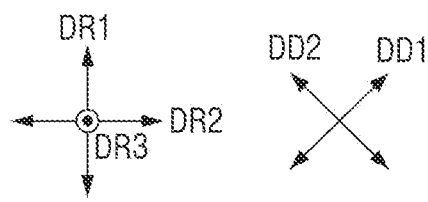

DISPLAY DEVICE AND METHOD FOR MANUFACTURING THE SAME

CROSS-REFERENCE TO RELATED APPLICATION

This application claims priority to and the benefit of Korean Patent Application No. 10-2022-0102083 filed on Aug. 16, 2022 in the Korean Intellectual Property Office, the entire content of which is herein incorporated by reference.

BACKGROUND

1. Field

One or more embodiments of the present disclosure relate to a display device and a method for manufacturing the same.

2. Description of the Related Art

As the information society develops, demand for display devices for displaying images has increased and diversified. The display devices may be flat panel display devices such as liquid crystal displays (LCDs), field emission displays (FEDs), and/or light emitting displays (LEDs). Light emitting display devices may include an organic light emitting display device including organic light emitting diode elements as light emitting elements, an inorganic light emitting display device including inorganic semiconductor elements as light emitting elements, and/or a micro light emitting display device including micro light emitting diode elements as light emitting elements.

Recently, head mounted displays (HMDs) including the light emitting display devices have been developed. The head mounted display (HMD) is a glasses-type (e.g., glasses-like) monitor device for virtual reality (VR) and/or augmented reality (AR) that is worn in the form of glasses or a helmet by a user and forms a focus at a distance close to user's eyes in front of the user's eyes.

A high-resolution micro light emitting diode display panel including micro light emitting diode elements is applied to the head mounted display. Because the micro light emitting diode element emits (or is configured to emit) light of a single color, the micro light emitting diode display panel may include a color conversion layer converting (or configured to convert) a wavelength of light emitted from the micro light emitting diode element in order to display various colors.

SUMMARY

One or more aspects of embodiments of the present disclosure are directed toward a display device in which luminous efficiency of light emitting elements may be improved, and a method for manufacturing the same.

However, aspects and embodiments of the present disclosure are not restricted to those set forth herein. The above and other aspects and embodiments of the present disclosure will become more apparent to one of ordinary skill in the art to which the present disclosure pertains by referencing the detailed description of the present disclosure given below.

According to one or more embodiments of the present disclosure, a display device may include a substrate; a first light emitting element, a second light emitting element, and a third light emitting element on the substrate, the first light emitting element, the second light emitting element, and the third light emitting element each including a first semiconductor layer, an active layer, and a second semiconductor layer; a third semiconductor layer on the first light emitting element, a first color conversion layer on the second light emitting element, and a second color conversion layer on the third light emitting element, wherein the first color conversion layer and the second color conversion layer may include the same semiconductor material as the third semiconductor layer, and may further include dopants different from a dopant of the second semiconductor layer.

In one or more embodiments, the semiconductor material of each of the first color conversion layer and the second color conversion layer may be at least one of AlGaInN, GaN, AlGaN, InGaN, AlN, or InN.

In one or more embodiments, the dopant of the first color conversion layer may be erbium (Er) and the dopant of the second color conversion layer may be europium (Eu).

In one or more embodiments, the first color conversion layer may include GaN doped with erbium (Er), and the second color conversion layer may include GaN doped with europium (Eu).

In one or more embodiments, each of the first color conversion layer and the second color conversion layer may have a thickness of 50 nm to 1000 nm.

In one or more embodiments, each of the first light emitting element, the second light emitting element, and the third light emitting element may emit light of a blue wavelength band.

In one or more embodiments, the first color conversion layer may convert the light of the blue wavelength band into a light of a green wavelength band and may emit the light of the green wavelength band, and the second color conversion layer may convert the light of the blue wavelength band into a light of a red wavelength band and may emit the light of the red wavelength band.

In one or more embodiments, the display device may further include a first connection electrode on the second semiconductor layer of each of the first light emitting element, the second light emitting element, and the third light emitting element, and a second connection electrode on the first semiconductor layer of each of the first light emitting element, the second light emitting element, and the third light emitting element.

In one or more embodiments, each of the first light emitting element, the second light emitting element, and the third light emitting element may include a hole penetrating through the first semiconductor layer and the active layer to expose the second semiconductor layer, and the first connection electrode may be in contact with the second semiconductor layer through the hole.

In one or more embodiments, the substrate includes a plurality of pixel electrodes, a plurality of second contact electrodes provided on the plurality of pixel electrodes, a plurality of common lines, and a plurality of first contact electrodes provided on the plurality of common lines, and the first connection electrode is connected to a corresponding first contact electrode of the plurality of first contact electrodes, and the second connection electrode is connected to a corresponding second contact electrode of the plurality of second contact electrodes.

In one or more embodiments, the display device may further include a barrier layer partitioning the first light emitting element, the second light emitting element, and the third light emitting element while surrounding the first light emitting element, the second light emitting element, and the third light emitting element, wherein an upper surface of the third semiconductor layer, an upper surface of the first color conversion layer, and an upper surface of the second color conversion layer may be aligned and coincide with each other.

In one or more embodiments, each of the first color conversion layer and the second color conversion layer may have a single-layer or a multilayer structure, and the multilayer structure may include first conversion layers and second conversion layers that are alternately stacked, the first conversion layers including a semiconductor material doped with a dopant, and the second conversion layers including a semiconductor material.

According to one or more embodiments of the present disclosure, a method for manufacturing a display device may include forming a first emission area, a second emission area, and a third emission area by forming a third semiconductor layer and a barrier layer on a target substrate, further growing the third semiconductor layer in the first emission area, forming a first color conversion layer in the second emission area, and forming a second color conversion layer in the third emission area, forming light emitting elements in the first emission area, the second emission area, and the third emission area, respectively, forming holes by etching the light emitting elements, forming connection electrodes on the light emitting elements, and bonding the light emitting elements to a semiconductor circuit substrate, wherein the first color conversion layer is grown from the third semiconductor layer and is doped with erbium (Er) as a dopant, and the second color conversion layer is grown from the third semiconductor layer and is doped with europium (Eu) as a dopant.

In one or more embodiments, the first color conversion layer and the second color conversion layer may be grown by the third semiconductor layer acting as a seed, and reactive gases including the corresponding dopants may flow to the first color conversion layer and the second color conversion layer.

In one or more embodiments, the further growing of the third semiconductor layer in the first emission area, the forming of the first color conversion layer in the second emission area, and the forming of the second color conversion layer in the third emission area may include forming first insulating patterns in the second emission area and the third emission area and growing the third semiconductor layer in the first emission area, forming a second insulating pattern in the first emission area, removing the first insulating pattern of the second emission area, and then forming the first color conversion layer in the second emission area, forming a third insulating pattern on the first color conversion layer, removing the first insulating pattern of the third emission area, and then forming the second color conversion layer in the third emission area, and removing the second insulating pattern and the third insulating pattern.

In one or more embodiments, in the forming of the light emitting elements, a second semiconductor layer, an active layer, and a first semiconductor layer may be sequentially grown.

In one or more embodiments, in the forming of the holes, the second semiconductor layer may be exposed by etching the active layer and the first semiconductor layer.

In one or more embodiments, the method for manufacturing a display device may further include, after the forming of the light emitting elements, forming first connection electrodes on the second semiconductor layers of the light emitting elements and forming second connection electrodes on the first semiconductor layers through the holes.

In one or more embodiments, in the bonding of the light emitting elements to the semiconductor circuit substrate, contact electrodes on the semiconductor circuit substrate and the first and second connection electrodes may be fusion-bonded to each other.

According to one or more embodiments of the present disclosure, a display device may include a substrate, a light emitting element on the substrate and including a first semiconductor layer, an active layer, and a second semiconductor layer, a barrier layer on the light emitting element and partitioning a first emission area, a second emission area and a third emission area to be spaced apart from each other, a third semiconductor layer overlapping the first emission area, a first color conversion layer overlapping the second emission area, and a second color conversion layer overlapping the third emission area, wherein the first color conversion layer may include a semiconductor material doped with erbium (Er), and the second color conversion layer may include a semiconductor material doped with europium (Eu).

With a display device and a method for manufacturing the same according to embodiments, color conversion layers are manufactured by semiconductor growth, such that a process may be simplified and there may be an advantage in implementing high resolution.

In addition, growth temperatures of the color conversion layer and an active layer are similar to each other, such that damage to the active layer due to heat may be prevented or reduced, and thus, a decrease in efficiency of light emitting elements may be prevented or reduced.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in more detail embodiments thereof with reference to the attached drawings, in which:

FIG. 3 is a layout diagram illustrating pixels of a display panel according to one or more embodiments;

FIGS. 15-24 are cross-sectional views for describing the method for manufacturing a display device according to one or more embodiments;

FIGS. 28-32 are layout diagrams illustrating another example of area A of FIG. 1 in more detail;

DETAILED DESCRIPTION

Figure 1:
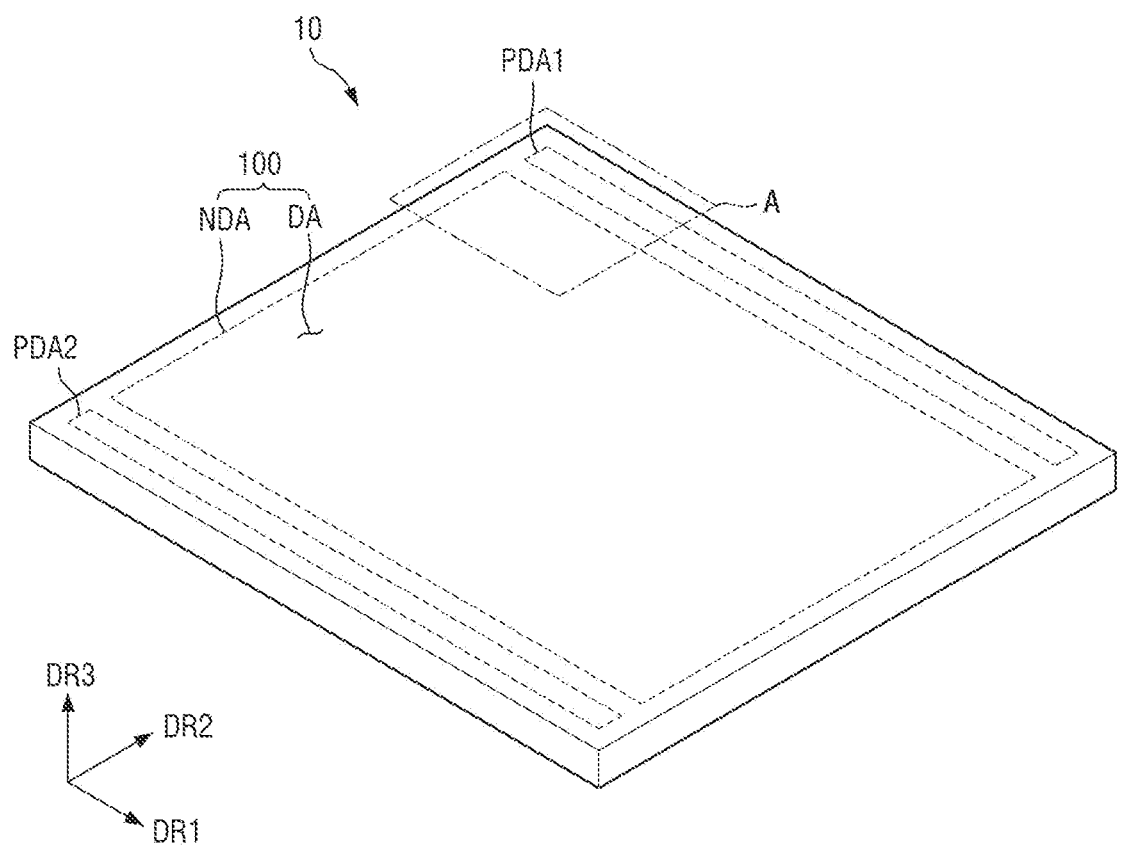
FIG. 1 is a layout diagram illustrating a display device according to one or more embodiments.

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate (e.g., without any intervening layers therebetween), or one or more intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one selected from a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items. Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in some embodiments to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Hereinafter, example embodiments will be described with reference to the accompanying drawings.

Figure 2:
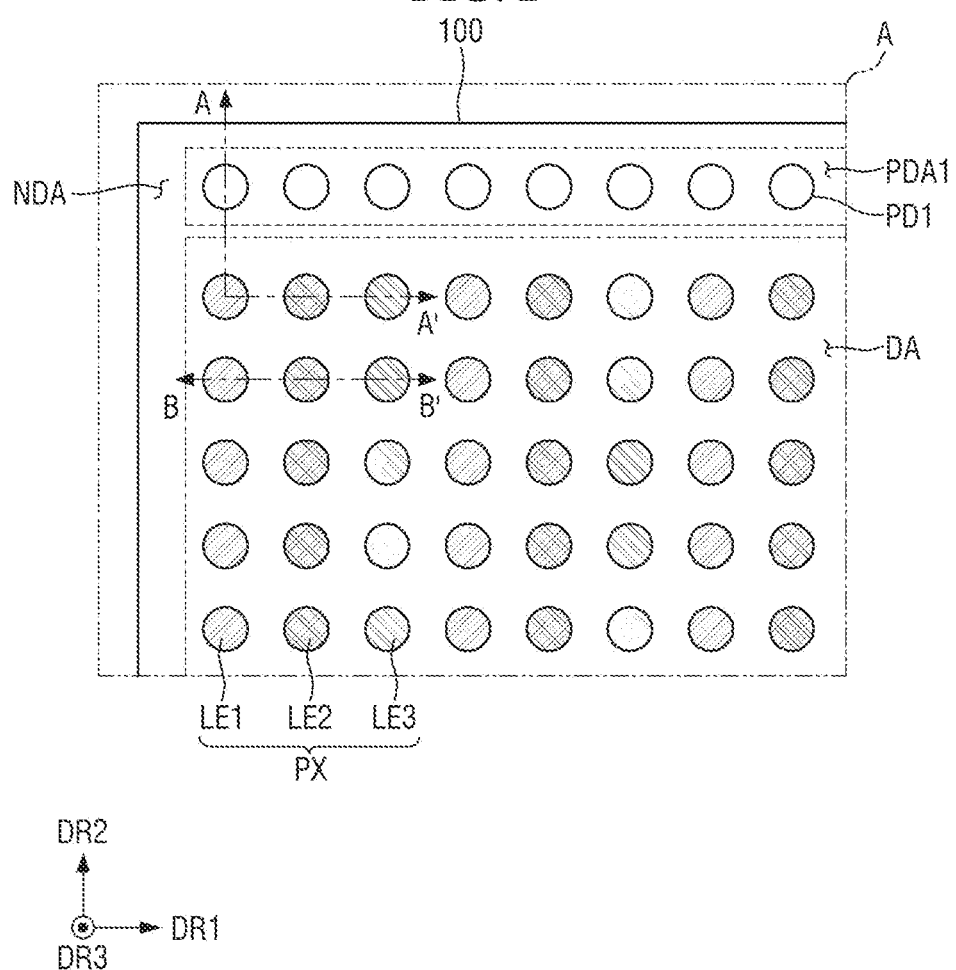
FIG. 2 is a layout diagram illustrating area A of FIG. 1 in more detail.

FIG. 1 is a layout diagram illustrating a display device according to one or more embodiments. FIG. 2 is a layout diagram illustrating area A of FIG. 1 in more detail. FIG. 3 is a layout diagram illustrating pixels of a display panel according to one or more embodiments.

It will be mainly described in FIGS. 1 to 3 that a display device according to one or more embodiments is a micro or nano light emitting diode display device including micro or nano light emitting diodes as light emitting elements, but one or more embodiments of the present disclosure is not limited thereto.

In addition, it will be mainly described in FIGS. 1 to 3 that the display device according to one or more embodiments is a Light Emitting Diode on Silicon (LEDoS) in which light emitting diodes are provided as light emitting elements on a semiconductor circuit substrate 110 formed by a semiconductor process using a silicon wafer, but it is to be noted that one or more embodiments of the present disclosure is not limited thereto.

In FIGS. 1 to 3, a first direction DR1 refers to a transverse (e.g., horizontal or length) direction of a display panel 100, a second direction DR2 refers to a longitudinal (e.g., vertical or height) direction of the display panel 100, and a third direction DR3 refers to a thickness direction of the display panel 100 or a thickness direction of the semiconductor circuit substrate 110. In this case, "left", "right", "upper", and "lower" refer to directions when the display panel 100 is viewed in plan view. For example, "right side" refers to one side in the first direction DR1, "left side" refers to the other side in the first direction DR1, "upper side" refers to one side in the second direction DR2, and "lower side" refers to the other side in the second direction DR2. In some embodiments, "upper portion" refers to one side in the third direction DR3, and "lower portion" refers to the other side in the third direction DR3.

Referring to FIGS. 1 to 3, a display device 10 according to one or more embodiments includes a display panel 100 including a display area DA and a non-display area NDA.

The display panel 100 may have a rectangular shape, in plan view, having long sides in the first direction DR1 and short sides in the second direction DR2. However, the shape of the display panel 100 in plan view is not limited thereto, and the display panel 100 may have polygonal shapes other than the rectangular shape, a circular shape, an elliptical shape, or an irregular shape in plan view, without limitation.

The display area DA may be an area in which an image is displayed, and the non-display area NDA may be area in which an image is not displayed. A shape of the display area DA in plan view may follow the shape of the display panel 100 in plan view. It has been illustrated in FIG. 1 that the shape of the display area DA in plan view is a rectangular shape. The display area DA may be provided in a central area of the display panel 100. The non-display area NDA may be provided around the display area DA. The non-display area NDA may be provided to surround the display area DA.

The display area DA of the display panel 100 may include a plurality of pixels PX. The pixel PX may be defined as a minimum light emitting unit capable of displaying white light.

Each of the plurality of pixels PX may include first to third light emitting elements LE1, LE2, and LE3 that emit (or are configured to emit) light. It has been illustrated in one or more embodiments of the present disclosure that each of the plurality of pixels PX includes three light emitting elements LE1, LE2, and LE3, but one or more embodiments of the present disclosure is not limited thereto. Further, it has been illustrated that each of the first to third light emitting elements LE1, LE2, and LE3 has a circular shape in plan view, but one or more embodiments of the present disclosure is not limited thereto.

A first light emitting element LE1 may emit first light. The first light may be light of a blue wavelength band. For example, a main peak wavelength (B-peak) of the first light may be positioned at approximately 370 nm to 460 nm, but one or more embodiments of the present disclosure is not limited thereto.

A second light emitting element LE2 may emit second light. The second light may be light of a green wavelength band. For example, a main peak wavelength (G-peak) of the second light may be positioned at approximately 480 nm to 560 nm, but one or more embodiments of the present disclosure is not limited thereto.

A third light emitting element LE3 may emit the first light. The first light may be light of a blue wavelength band. For example, a main peak wavelength (B-peak) of the first light may be positioned at approximately 370 nm to 460 nm, but one or more embodiments of the present disclosure is not limited thereto. In the present embodiments, the third light emitting element LE3 may emit the first light, which may be converted into third light by a wavelength conversion layer and/or a color filter to be described in more detail herein below. The third light may be light of a red wavelength band. The red wavelength band may be approximately 600 nm to 750 nm.

The first light emitting elements LE1, the second light emitting elements LE2, and the third light emitting elements LE3 may be alternately arranged with each other in the first direction DR1. For example, the first light emitting elements LE1, the second light emitting elements LE2, and the third light emitting elements LE3 may be provided in the order of the first light emitting element LE1, the second light emitting element LE2, and the third light emitting element LE3 in the first direction DR1. The first light emitting elements LE1 may be arranged with each other in the second direction DR2. The second light emitting elements LE2 may be arranged with each other in the second direction DR2. The third light emitting elements LE3 may be arranged with each other in the second direction DR2.

The non-display area NDA may include a first pad part PDA1 and a second pad part PDA2.

The first pad part PDA1 may be provided on an upper side of the display panel 100. The first pad part PDA1 may include first pads PD1 connected to an external circuit board.

The second pad part PDA2 may be provided on a lower side of the display panel 100. The second pad part PDA2 may include second pads PD2 to be connected to the external circuit board. The second pad part PDA2 may be omitted (e.g., may not be provided).

Figure 4:
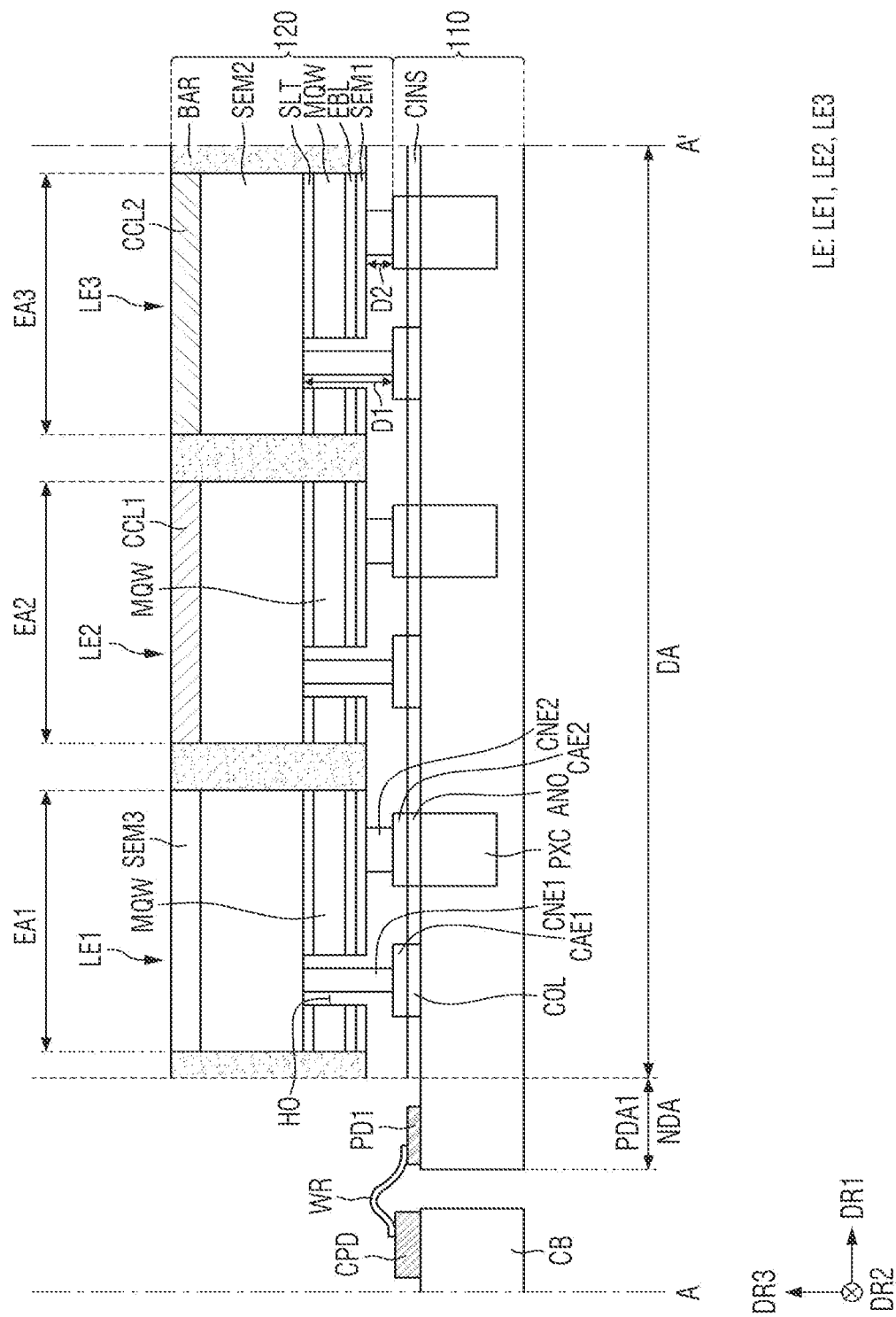
FIG. 4 is a cross-sectional view illustrating an example of the display panel taken along line A-A' of FIG. 2.
Figure 5:
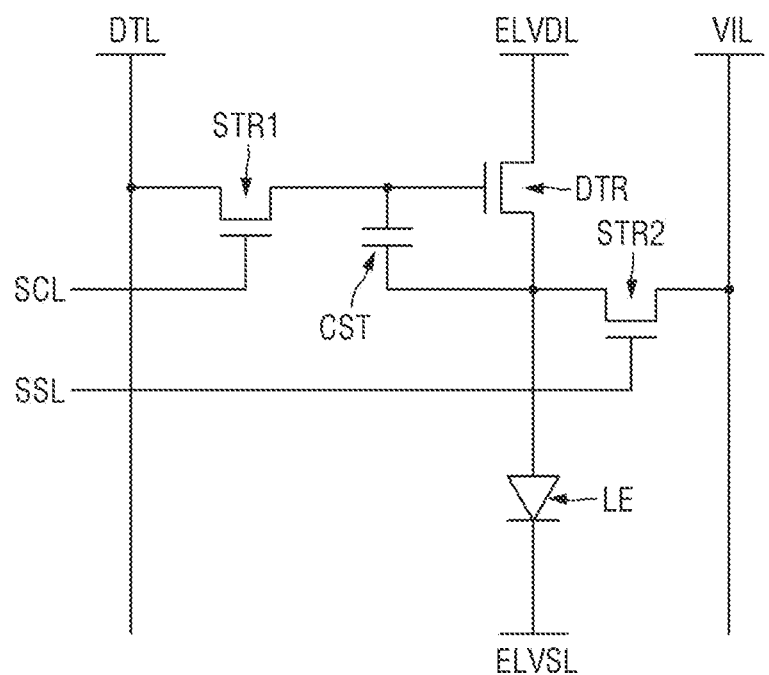
FIG. 5 is an equivalent circuit diagram of one pixel of the display device according to one or more embodiments.
Figure 6:
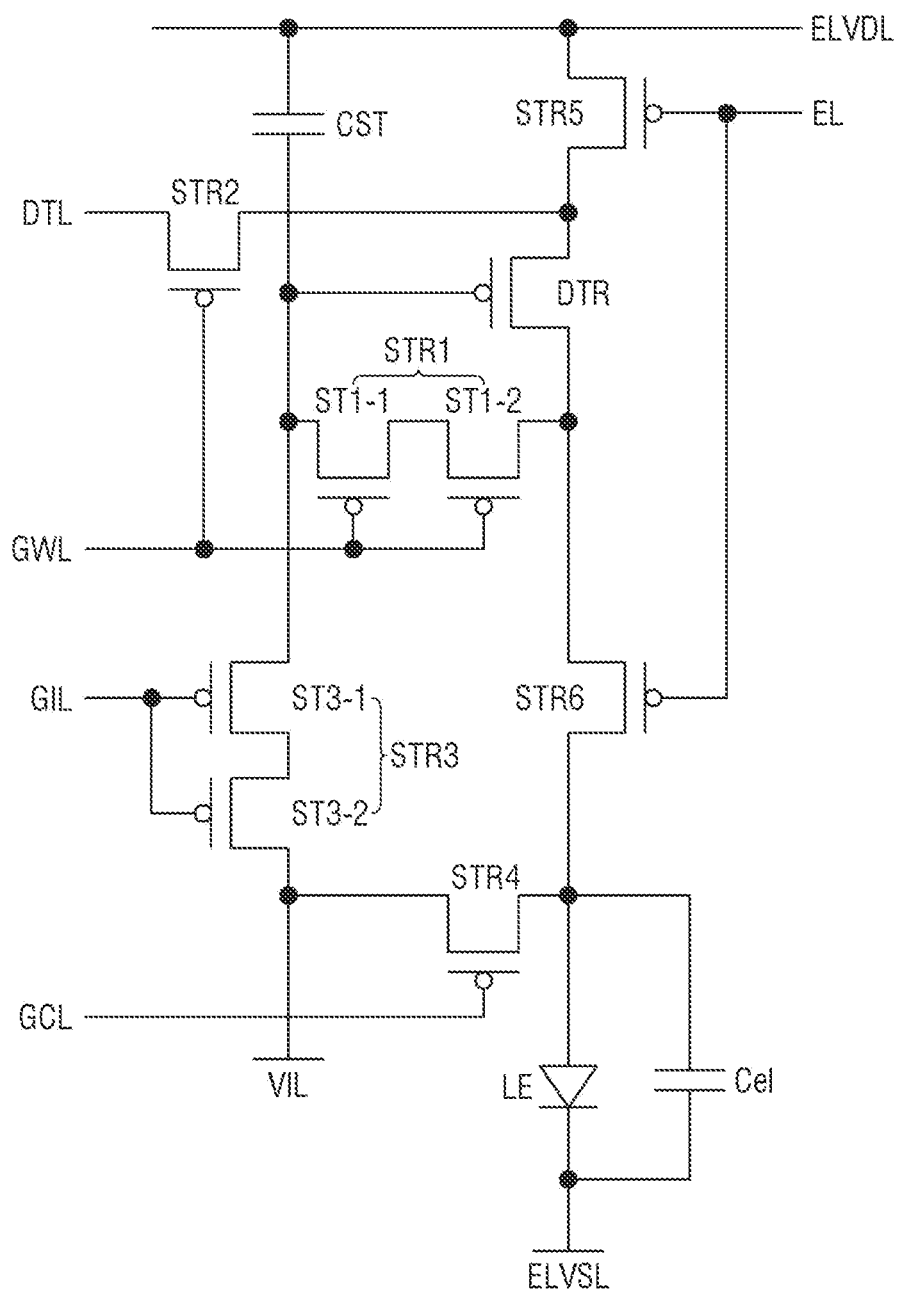
FIG. 6 is an equivalent circuit diagram of one pixel of a display device according to one or more embodiments.
Figure 7:
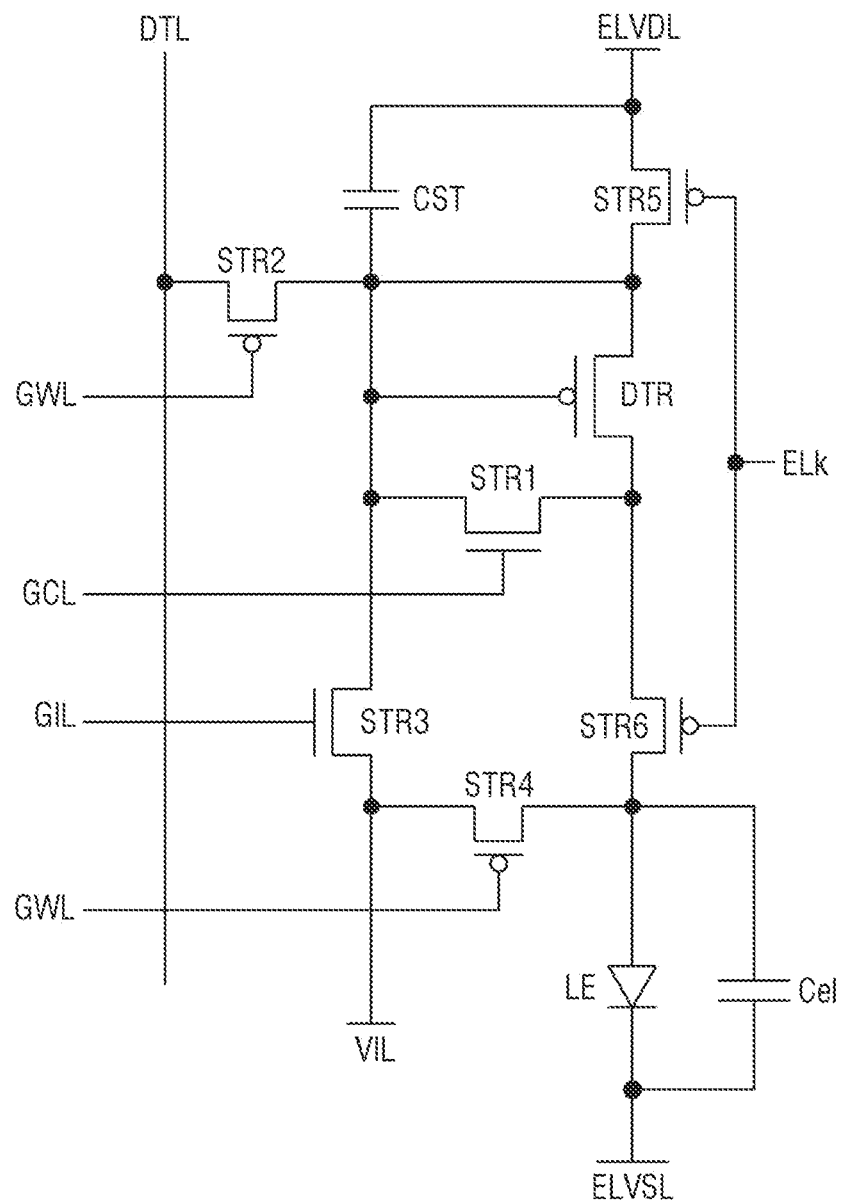
FIG. 7 is an equivalent circuit diagram of one pixel of a display device according to one or more embodiments.
Figure 8:
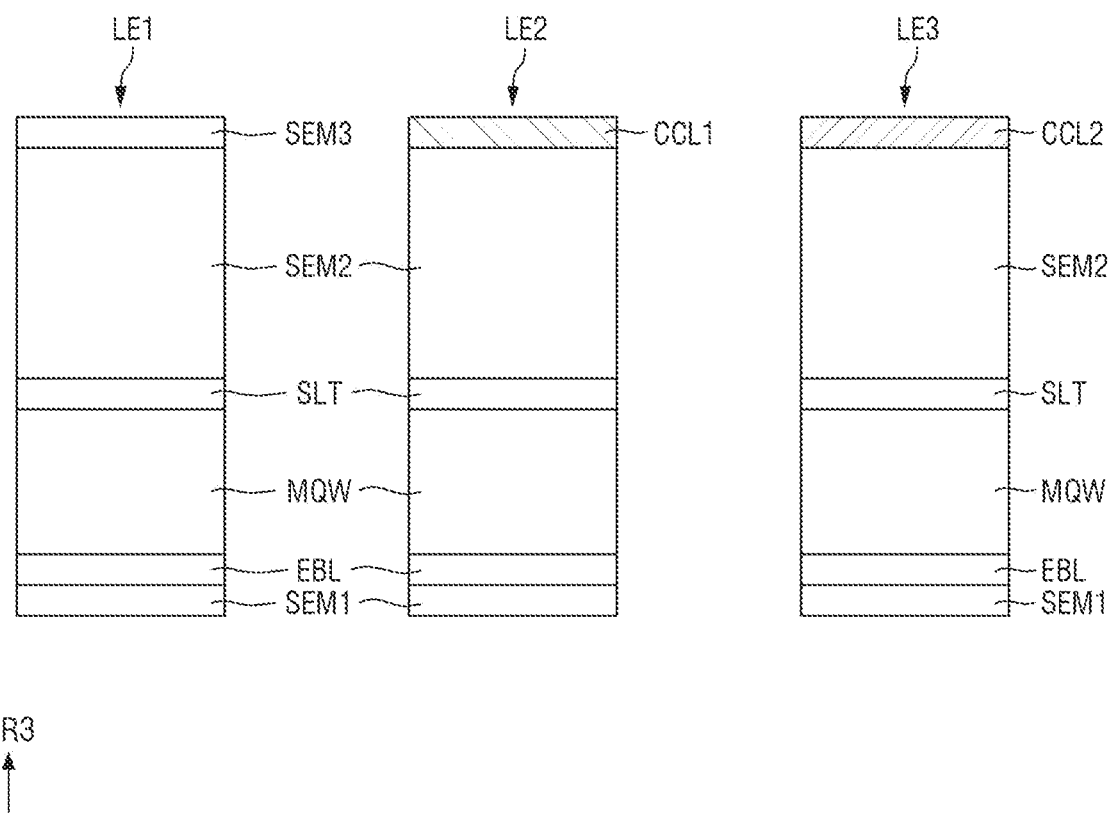
FIG. 8 is a cross-sectional view illustrating a schematic structure of respective light emitting elements according to one or more embodiments.
Figure 9:
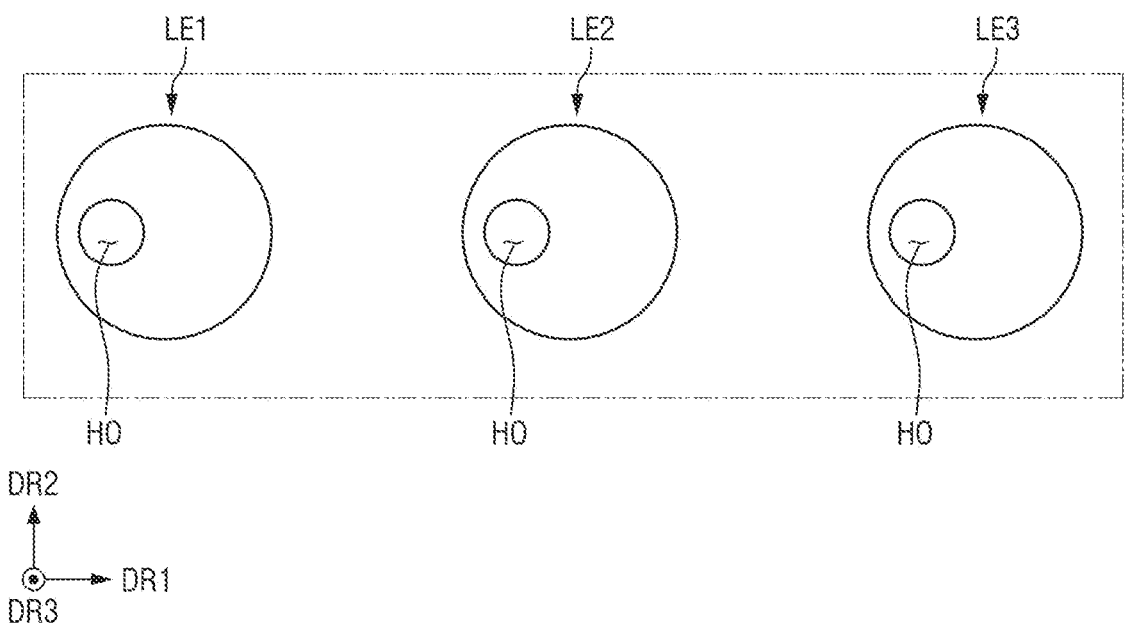
FIG. 9 is a plan view illustrating the respective light emitting elements according to one or more embodiments.

FIG. 4 is a cross-sectional view illustrating an example of the display panel taken along line A-A' of FIG. 2. FIG. 5 is an equivalent circuit diagram of one pixel of the display device according to one or more embodiments. FIG. 6 is an equivalent circuit diagram of one pixel of a display device according to one or more embodiments. FIG. 7 is an equivalent circuit diagram of one pixel of a display device according to one or more embodiments. FIG. 8 is a cross-sectional view illustrating a schematic structure of respective light emitting elements according to one or more embodiments. FIG. 9 is a plan view illustrating the respective light emitting elements according to one or more embodiments.

Referring to FIGS. 4 to 9, the display panel 100 according to one or more embodiments may include a semiconductor circuit substrate 110 and a light emitting element layer 120.

The semiconductor circuit substrate 110 may include a plurality of pixel circuit units PXC, common lines COL, pixel electrodes ANO, contact electrodes CAE1 and CAE2, first pads PD1, and a circuit insulating layer CINS.

The semiconductor circuit substrate 110 is a silicon wafer substrate formed using a suitable semiconductor process, and may be a first substrate. The plurality of pixel circuit units PXC of the semiconductor circuit substrate 110 may be formed using a suitable semiconductor process.

The plurality of pixel circuit units PXC may be provided in the display area DA and the non-display area NDA. Each of the plurality of pixel circuit units PXC may be connected (e.g., electrically coupled) to the pixel electrode ANO corresponding thereto. For example, the plurality of pixel circuit units PXC and a plurality of pixel electrodes ANO may be connected to each other so as to correspond to each other in a one-to-one manner. Each of the plurality of pixel circuit units PXC may overlap the light emitting element LE in the third direction DR3.

Each of the plurality of pixel circuit units PXC may include at least one transistor formed by a suitable semiconductor process. In some embodiments, each of the plurality of pixel circuit units PXC may further include at least one capacitor formed by a suitable semiconductor process. The plurality of pixel circuit units PXC may include, for example, complementary metal oxide semiconductor (CMOS) circuits. Each of the plurality of pixel circuit units PXC may apply a pixel voltage or an anode voltage to the pixel electrode ANO.

Referring to FIG. 5, each of the plurality of pixel circuit units PXC according to one or more embodiments may include three transistors DTR, STR1, and STR2 and one storage capacitor CST.

The light emitting element LE emits light according to a current supplied through a driving transistor DTR. The light emitting element LE may be implemented as an inorganic light emitting diode, an organic light emitting diode, a micro light emitting diode, a nano light emitting diode, and/or the like.

A first electrode (i.e., an anode electrode) of the light emitting element LE may be connected (e.g., electrically coupled) to a source electrode of the driving transistor DTR, and a second electrode (i.e., a cathode electrode) of the light emitting element LE may be connected (e.g., electrically coupled) to a second power line ELVSL to which a low potential voltage (second source voltage) lower than a high potential voltage (first source voltage) of a first power line ELVDL is supplied.

The driving transistor DTR adjusts a current flowing from the first power line ELVDL to which the first source voltage is supplied to the light emitting element LE according to a voltage difference between a gate electrode and the source electrode thereof. The gate electrode of the driving transistor DTR may be connected to a first electrode of a first transistor STR1, the source electrode of the driving transistor DTR may be connected to the first electrode of the light emitting element LE, and a drain electrode of the driving transistor DTR may be connected to the first power line ELVDL to which the first source voltage is applied.

The first transistor STR1 is turned on by a scan signal of a scan line SCL to connect a data line DTL to the gate electrode of the driving transistor DTR. A gate electrode of the first transistor STR1 may be connected to the scan line SCL, the first electrode of the first transistor STR1 may be connected to the gate electrode of the driving transistor DTR, and a second electrode of the first transistor STR1 may be connected to the data line DTL.

A second transistor STR2 is turned on by a sensing signal of a sensing signal line SSL to connect an initialization voltage line VIL to the source electrode of the driving transistor DTR. A gate electrode of the second transistor STR2 may be connected to the sensing signal line SSL, a first electrode of the second transistor STR2 may be connected to the initialization voltage line VIL, and a second electrode of the second transistor STR2 may be connected to the source electrode of the driving transistor DTR.

In one or more embodiments, the first electrode of each of the first and second transistors STR1 and STR2 may be a source electrode, and the second electrode of each of the first and second transistors STR1 and STR2 may be a drain electrode, and vice versa, but the present disclosure is not limited thereto.

The storage capacitor CST is formed between the gate electrode and the source electrode of the driving transistor DTR. The storage capacitor CST stores a difference voltage between a gate voltage and a source voltage of the driving transistor DTR.

The driving transistor DTR and the first and second transistors STR1 and STR2 may be formed as thin film transistors. In some embodiments, it has been mainly described in FIG. 5 that the driving transistor DTR and the first and second transistors STR1 and STR2 are N-channel metal oxide semiconductor field effect transistors (MOSFETs), but the present disclosure is not limited thereto. For example, the driving transistor DTR and the first and second transistors STR1 and STR2 may be P-channel MOSFETs, or some of the driving transistor DTR and the first and second transistors STR1 and STR2 may be N-channel MOSFETs and the others of the driving transistor DTR and the first and second transistors STR1 and STR2 may be P-channel MOSFETs.

Referring to FIG. 6, a first electrode of a light emitting element LE of a pixel circuit unit PXC according to some embodiments may be connected to a first electrode of a fourth transistor STR4 and a second electrode of a sixth transistor STR6, and a second electrode of the light emitting element LE may be connected to a second power line ELVSL. A parasitic capacitance Cel may be formed between the first electrode and the second electrode of the light emitting element LE.

Each pixel PX includes a driving transistor DTR, switch elements, and a capacitor CST. The switch elements include first to sixth transistors STR1, STR2, STR3, STR4, STR5, and STR6.

The driving transistor DTR includes a gate electrode, a first electrode, and a second electrode. The driving transistor DTR controls a drain-source current Ids (hereinafter, referred to as a "driving current") flowing between the first electrode and the second electrode according to a data voltage applied to the gate electrode.

The capacitor CST is formed between the second electrode of the driving transistor DTR and a first power line ELVDL. One electrode of the capacitor CST may be connected to the second electrode of the driving transistor DTR, and the other electrode of the capacitor CST may be connected to the first power line ELVDL.

When a first electrode of each of the first to sixth transistors STR1, STR2, STR3, STR4, STR5, and STR6 and the driving transistor DTR is a source electrode, a second electrode of each of the first to sixth transistors STR1, STR2, STR3, STR4, STR5, and STR6 and the driving transistor DTR may be a drain electrode. In some embodiments, when the first electrode of each of the first to sixth transistors STR1, STR2, STR3, STR4, STR5, and STR6 and the driving transistor DTR is a drain electrode, the second electrode of each of the first to sixth transistors STR1, STR2, STR3, STR4, STR5, and STR6 and the driving transistor DTR may be a source electrode.

An active layer of each of the first to sixth transistors STR1, STR2, STR3, STR4, STR5, and STR6 and the driving transistor DTR may be made of any one selected from polysilicon, amorphous silicon, and an oxide semiconductor. When the active layer of each of the first to sixth transistors STR1, STR2, STR3, STR4, STR5, and STR6 and the driving transistor DTR is made of the polysilicon, a process for forming the active layer may be a low temperature polysilicon (LTPS) process.

In some embodiments, it has been mainly described in FIG. 6 that each of the first to sixth transistors STR1, STR2, STR3, STR4, STR5, and STR6 and the driving transistor DTR is formed as a P-channel MOSFET, but the present disclosure is not limited thereto, and each of the first to sixth transistors STR1, STR2, STR3, STR4, STR5, and STR6 and the driving transistor DTR may also be formed as an N-channel MOSFET.

A first source voltage of the first power line ELVDL, a second source voltage of the second power line ELVSL, and a third source voltage of an initialization voltage line VIL may be set in consideration of characteristics of the driving transistor DTR, characteristics of the light emitting element LE, and/or the like.

Referring to FIG. 7, a pixel circuit unit PXC according to some embodiments is different from the pixel circuit unit PXC according to the embodiment of FIG. 6 in that a driving transistor DTR, a second transistor STR2, a fourth transistor STR4, a fifth transistor STR5, and a sixth transistor STR6 may be formed as P-channel MOSFETs and a first transistor STR1 and a third transistor STR3 may be formed as N-channel MOSFETs.

An active layer of each of the driving transistor DTR, the second transistor STR2, the fourth transistor STR4, the fifth transistor STR5, and the sixth transistor STR6 formed as the P-channel MOSFETs may be made of polysilicon, and an active layer of each of the first transistor STR1 and the third transistor STR3 formed as the N-channel MOSFETs may be made of an oxide semiconductor.

The embodiment of FIG. 7 is different from the embodiment of FIG. 6 in that a gate electrode of the second transistor STR2 and a gate electrode of the fourth transistor STR4 are connected to a write scan line GWL and a gate electrode of the first transistor STR1 is connected to a control scan line GCL. In FIG. 7, the first transistor STR1 and the third transistor STR3 are formed as the N-channel MOSFETs, and thus, a scan signal of a gate high voltage may be applied to the control scan line GCL and an initialization scan line GIL. In some embodiments, the second transistor STR2, the fourth transistor STR4, the fifth transistor STR5, and the sixth transistor STR6 are formed as the P-channel MOSFETs, and thus, a scan signal of a gate low voltage may be applied to the write scan line GWL and an emission line EL.

It is to be noted that the equivalent circuit diagram of the pixel according to one or more embodiments of the present disclosure described herein is not limited to those illustrated in FIGS. 5 to 7. The equivalent circuit diagram of the pixel according to one or more embodiments of the present disclosure may be formed in other suitable circuit structures that may be adopted by one of ordinary skill in the art in addition to embodiments illustrated in FIGS. 5 to 7.

In one or more embodiments, the plurality of pixel electrodes ANO may be provided on the pixel circuit units PXC corresponding thereto. Each of the pixel electrodes ANO may be an exposed electrode exposed from the pixel circuit unit PXC. Each of the pixel electrodes ANO may be formed integrally with the pixel circuit unit PXC. Each of the pixel electrodes ANO may receive a pixel voltage or an anode voltage supplied from the pixel circuit unit PXC. The pixel electrodes ANO may include at least one selected from gold (Au), copper (Cu), tin (Sn), and silver (Ag). For example, the pixel electrode ANO may include an alloy of gold and tin between which a ratio is 9:1, 8:2, or 7:3, or include an alloy of copper, silver, and tin (e.g., SAC305).

The common lines COL may be provided in the display area DA. Each of the common lines COL may be provided to correspond to the pixel circuit unit PXC. Each of the common lines COL may be connected to a second semiconductor layer SEM2 of each light emitting element LE to supply a common voltage or a cathode voltage. The common line COL may include at least one of copper (Cu), molybdenum (Mo), titanium (Ti), or aluminum (Al). Each of the common lines COL may be connected to any one of the first pads PD1 of the first pad part PDA1 through a circuit unit formed in the non-display area NDA to receive a common voltage.

The circuit insulating layer CINS may be provided on the pixel circuit units PXC. The circuit insulating layer CINS may protect the pixel circuit units PXC and may planarize (or substantially planarize) a step of the pixel circuit units PXC. The circuit insulating layer CINS may expose each of the pixel electrodes ANO and the common lines COL so that the pixel electrodes ANO and the common lines COL may be connected to the light emitting element layer 120. The circuit insulating layer CINS may include an inorganic insulating material such as silicon oxide ($SiO_x$), silicon nitride ($SiN_x$), silicon oxynitride ($SiO_xN_y$), aluminum oxide ($Al_xO_y$), and/or aluminum nitride (AlN).

The contact electrodes CAE1 and CAE2 may be provided on the pixel electrodes ANO and the common lines COL corresponding thereto. For example, the contact electrodes CAE1 and CAE2 may include first contact electrodes CAE1 and second contact electrodes CAE2. The first contact electrodes CAE1 may be provided on the common lines COL, and the second contact electrodes CAE2 may be provided on the pixel electrodes ANO.

The contact electrodes CAE1 and CAE2 may include a metal material for adhering the pixel electrode ANO and the light emitting element LE to each other and adhering the common line COL and the light emitting element LE to each other. For example, the contact electrodes CAE1 and CAE2 may include at least one selected from gold (Au), copper (Cu), aluminum (Al), and tin (Sn). In some embodiments, the contact electrodes CAE1 and CAE2 may include a first layer including any one selected from gold (Au), copper (Cu), aluminum (Al), and tin (Sn) and a second layer including another selected from gold (Au), copper (Cu), aluminum (Al), and tin (Sn).

Each of the first pads PD1 may be connected to a pad electrode CPD of a circuit board CB through a conductive connection member such as a wire WR corresponding thereto. For example, the first pads PD1, the wires WR, and the pad electrodes CPD of the circuit board CB may be connected to each other in a one-to-one manner.

The circuit board CB may be a flexible printed circuit board (FPCB), a printed circuit board (PCB), a flexible printed circuit (FPC), and/or a flexible film such as a chip on film (COF).

The second pads of the second pad part PDA2 may be substantially the same as the first pads PD1 described herein, and a description thereof will thus not be provided (e.g., will be omitted).

The light emitting element layer 120 may include light emitting elements LE, a barrier layer BAR, and connection electrodes CNE1 and CNE2.

The light emitting element layer 120 may include first emission areas EA1, second emission areas EA2, and third emission areas EA3 corresponding to the respective light emitting elements LE. The light emitting elements LE may be provided in each of the first emission areas EA1, the second emission areas EA2, and the third emission areas EA3 so as to correspond to the first emission areas EA1, the second emission areas EA2, and the third emission areas EA3 in a one-to-one manner.

The barrier layer BAR may partition the respective light emitting elements LE and may partition the respective emission areas EA1, EA2, and EA3. The barrier layer BAR may be provided to surround the light emitting elements LE, and may be in direct contact with side surfaces of the light emitting elements LE. Accordingly, the light emitting elements LE may not be exposed to external foreign materials such as dust and/or air during processes for manufacturing the display device. The barrier layer BAR may include an inorganic insulating material such as silicon oxide ($SiO_x$), silicon nitride ($SiN_x$), silicon oxynitride ($SiO_xN_y$), aluminum oxide ($Al_xO_y$), and/or aluminum nitride (AlN) so as to insulate the respective light emitting elements LE from each other.

The light emitting element LE may be provided on the pixel electrode ANO in each of the first emission areas EA1, the second emission areas EA2, and the third emission areas EA3. The light emitting element LE may be a vertical light emitting diode element extending to be elongated in the third direction DR3. For example, a length of the light emitting element LE in the third direction DR3 may be greater than a length of the light emitting element LE in a horizontal direction. Here, the length in the horizontal direction refers to a length in the first direction DR1 or a length in the second direction DR2. For example, the length of the light emitting element LE in the third direction DR3 may be approximately 1 to 5 μm.

The light emitting element LE may be a micro light emitting diode element. The light emitting element LE may include a first semiconductor layer SEM1, an electron blocking layer EBL, an active layer MQW, a superlattice layer SLT, and a second semiconductor layer SEM2 in the third direction DR3. The first semiconductor layer SEM1, the electron blocking layer EBL, the active layer MQW, the superlattice layer SLT, and the second semiconductor layer SEM2 may be sequentially stacked in the third direction DR3.

The light emitting element LE may have a cylindrical shape, a disk shape, and/or a rod shape with a height greater than a width. However, the present disclosure is not limited thereto, and the light emitting element LE may have a shape such a rod shape, a wire shape, a tube shape, and/or a polygonal prismatic shape such as a cubic shape, a rectangular parallelepiped shape, and/or a hexagonal prismatic shape, or may have other suitable shapes such as a shape in which it extends in one direction and has outer surfaces partially inclined.

The first semiconductor layer SEM1 may be a p-type semiconductor, and may include a semiconductor material having a chemical formula of $Al_xGa_yIn_{1-x-y}N$ ($0 \le x \le 1$, $0 \le y \le 1$, and $0 \le x+y \le 1$). For example, the semiconductor material may be one or more selected from AlGaInN, GaN, AlGaN, InGaN, AlN, and InN doped with a p-type dopant. The first semiconductor layer SEM1 may be doped with a p-type dopant, which may be Mg, Zn, Ca, Se, Ba, and/or the like. For example, the first semiconductor layer SEM1 may be made of p-GaN doped with p-type Mg. A thickness of the first semiconductor layer SEM1 may be in the range of 30 nm to 200 nm, but is not limited thereto.

The electron blocking layer EBL may be provided on the first semiconductor layer SEM1. The electron blocking layer EBL may be a layer for suppressing, preventing, or reducing the flow of too many electrons into the active layer MQW. For example, the electron blocking layer EBL may be made of p-AlGaN doped with p-type Mg. A thickness of the electron blocking layer EBL may be in the range of 10 nm to 50 nm, but is not limited thereto. In some embodiments, the electron blocking layer EBL may not be provided (e.g., may be omitted).

The active layer MQW may be provided on the electron blocking layer EBL. The active layer MQW may emit light by a combination of electron-hole pairs according to electrical signals applied through the first semiconductor layer SEM1 and the second semiconductor layer SEM2.

The active layer MQW may include a material having a single or multiple quantum well structure. When the active layer MQW includes the material having the multiple quantum well structure, the active layer MQW may have a structure in which a plurality of well layers and barrier layers are alternately stacked. In some embodiments, the well layer may be made of InGaN, and the barrier layer may be made of GaN and/or AlGaN, but the present disclosure is not limited thereto. A thickness of the well layer may be approximately 1 to 4 nm, and a thickness of the barrier layer may be 3 nm to 10 nm.

The active layer MQW may have a structure in which semiconductor materials having large band gap energy and semiconductor materials having small band gap energy are alternately stacked, and may include other Group III to Group V semiconductor materials depending on a wavelength band of emitted light. The light emitted (or configured to be emitted) by the active layer MQW is not limited to the first light (the light of the blue wavelength band), and in some embodiments, the active layer MQW may emit the second light (the light of the green wavelength band) or the third light (the light of the red wavelength band).

In one or more embodiments, when the active layer MQW includes indium of the semiconductor materials, a color of the light emitted from the active layer MQW may be changed according to a content of indium. For example, the active layer MQW included in the light emitting element LE may include about 10% to 15% of indium and may emit the light of the blue wavelength band. However, the present disclosure is not limited thereto, and the active layer MQW of each light emitting element LE may include about 20% to 25% of indium and may emit the light of the green wavelength band. In some embodiments, the active layer MQW of each light emitting element LE may include about 30% to 45% of indium and may emit the light of the red wavelength band.

The superlattice layer SLT may be provided on the active layer MQW. The superlattice layer SLT may be a layer for alleviating or reducing stress between the second semiconductor layer SEM2 and the active layer MQW. For example, the superlattice layer SLT may be made of InGaN and/or GaN. A thickness of the superlattice layer SLT may be approximately 50 to 200 nm. The superlattice layer SLT may not be provided (e.g., may be omitted).

The second semiconductor layer SEM2 may be provided on the superlattice layer SLT. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more selected from AlGaInN, GaN, AlGaN, InGaN, AlN, and InN doped with an n-type dopant. The second semiconductor layer SEM2 may be doped with an n-type dopant, which may be Si, Ge, Sn, and/or the like. For example, the second semiconductor layer SEM2 may be made of n-GaN doped with n-type Si. A thickness of the second semiconductor layer SEM2 may be in the range of 2 μm to 4 μm, but is not limited thereto.

The active layer MQW of each of the light emitting elements LE may emit the light of the blue wavelength band. According to one or more embodiments, the second light emitting element LE2 and the third light emitting element LE3 may include color conversion layers to emit the light of the green wavelength band and the light of the red wavelength band, respectively. Accordingly, the first light emitting element LE1 may emit blue light, the second light emitting element LE2 may emit green light, and the third light emitting element LE3 may emit red light.

In one or more embodiments, the first light emitting element LE1 may include a third semiconductor layer SEM3. The third semiconductor layer SEM3 may be provided on the second semiconductor layer SEM2 of the first light emitting element LE1. The third semiconductor layer SEM3 may be provided in order to reduce a difference in lattice constant between the second semiconductor material layer SEM2 and a target substrate in a manufacturing process to be described in more detail herein below. As an example, the third semiconductor layer SEM3 may include an undoped semiconductor, and may be made of a material that is not doped with an n-type or p-type dopant. In one or more embodiments, the third semiconductor layer SEM3 may be made of at least one selected from undoped InAlGaN, GaN, AlGaN, InGaN, AlN, and InN, but is not limited thereto.

The third semiconductor layer SEM3 of the first light emitting element LE1 may be transparent to transmit light therethrough as it is. The light of the blue wavelength band emitted from the active layer MQW of the first light emitting element LE1 may be transmitted through the third semiconductor layer SEM3 and be emitted as it is. Accordingly, the light of the blue wavelength band may be emitted from the first emission area EA1. The third semiconductor layer SEM3 may be provided in a space partitioned by the barrier layer BAR, and an upper surface of the third semiconductor layer SEM3 may be aligned and coincide with an upper surface of the barrier layer BAR.

The second light emitting element LE2 may include a first color conversion layer CCL1. The first color conversion layer CCL1 may be directly provided on the second semiconductor layer SEM2 of the second light emitting element LE2. The first color conversion layer CCL1 may convert the light of the blue wavelength band emitted from the second light emitting element LE2 into the light of the green wavelength band.

The first color conversion layer CCL1 may include the same semiconductor material as the third semiconductor layer SEM3. The first color conversion layer CCL1 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more selected from AlGaInN, GaN, AlGaN, InGaN, AlN, and InN. The first color conversion layer CCL1 may be doped with a dopant, and may include a dopant different from that of the second semiconductor layer SEM2. The dopant may include erbium (Er). For example, the first color conversion layer CCL1 may be made of GaN:Er doped with erbium (Er).

In the first color conversion layer CCL1, holes and electrons may form excitons by energy of the light of the blue wavelength band emitted from the active layer MQW of the second light emitting element LE2 to emit the light of the green wavelength band. For example, the second light emitting element LE2 may convert the light of the blue wavelength band from the active layer MQW into the light of the green wavelength band in the first color conversion layer CCL1 and emit the light of the green wavelength band. Accordingly, the light of the green wavelength band may be emitted from the second emission area EA2.

A thickness of the first color conversion layer CCL1 may be in the range of 50 nm to 1000 nm. When the thickness of the first color conversion layer CCL1 is 50 nm or more, the dopants may be sufficiently or suitably dispersed in a semiconductor, such that color conversion efficiency may be increased, and when the thickness of the first color conversion layer CCL1 is 1000 nm or less, it is possible to prevent or reduce a phenomenon in which the dopants are agglomerated in the semiconductor, such that color conversion is not performed well or suitably. The first color conversion layer CCL1 may be provided in a space partitioned by the barrier layer BAR, and an upper surface of the first color conversion layer CCL1 may be aligned and coincide with the upper surface of the barrier layer BAR.

The third light emitting element LE3 may include a second color conversion layer CCL2. The second color conversion layer CCL2 may be directly provided on the second semiconductor layer SEM2 of the third light emitting element LE3. The second color conversion layer CCL2 may convert the light of the blue wavelength band emitted from the third light emitting element LE3 into the light of the red wavelength band.

The second color conversion layer CCL2 may include the same semiconductor material as the third semiconductor layer SEM3. The second color conversion layer CCL2 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more selected from AlGaInN, GaN, AlGaN, InGaN, AlN, and InN. The second color conversion layer CCL2 may be doped with a dopant, and may include a dopant different from that of the second semiconductor layer SEM2. The dopant may include europium (Eu). For example, the second color conversion layer CCL2 may be GaN:Eu doped with europium (Eu).

In the second color conversion layer CCL2, holes and electrons may form excitons by energy of the light of the blue wavelength band emitted from the active layer MQW of the third light emitting element LE3 to emit the light of the red wavelength band. For example, the third light emitting element LE3 may convert the light of the blue wavelength band from the active layer MQW into the light of the red wavelength band in the second color conversion layer CCL2 and emit the light of the red wavelength band. Accordingly, the light of the red wavelength band may be emitted from the third emission area EA3.

A thickness of the second color conversion layer CCL2 may be in the range of 50 nm to 1000 nm, similar to the first color conversion layer CCL1 described herein. When the thickness of the second color conversion layer CCL2 is 50 nm or more, the dopants may be sufficiently or suitably dispersed in a semiconductor, such that color conversion efficiency may be increased, and when the thickness of the second color conversion layer CCL2 is 1000 nm or less, it is possible to prevent or reduce a phenomenon in which the dopants are agglomerated in the semiconductor, such that color conversion is not performed well or suitably. The second color conversion layer CCL2 may be provided in a space partitioned by the barrier layer BAR, and an upper surface of the second color conversion layer CCL2 may be aligned and coincide with the upper surface of the barrier layer BAR.

Figure 10:
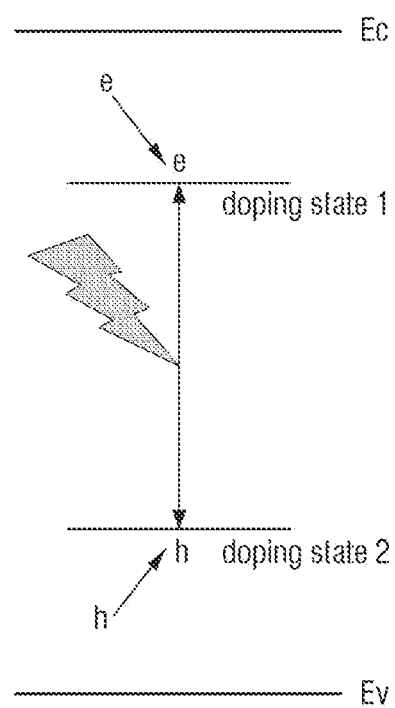
FIG. 10 is a schematic view illustrating an energy bandgap of a color conversion layer.
Figure 11:
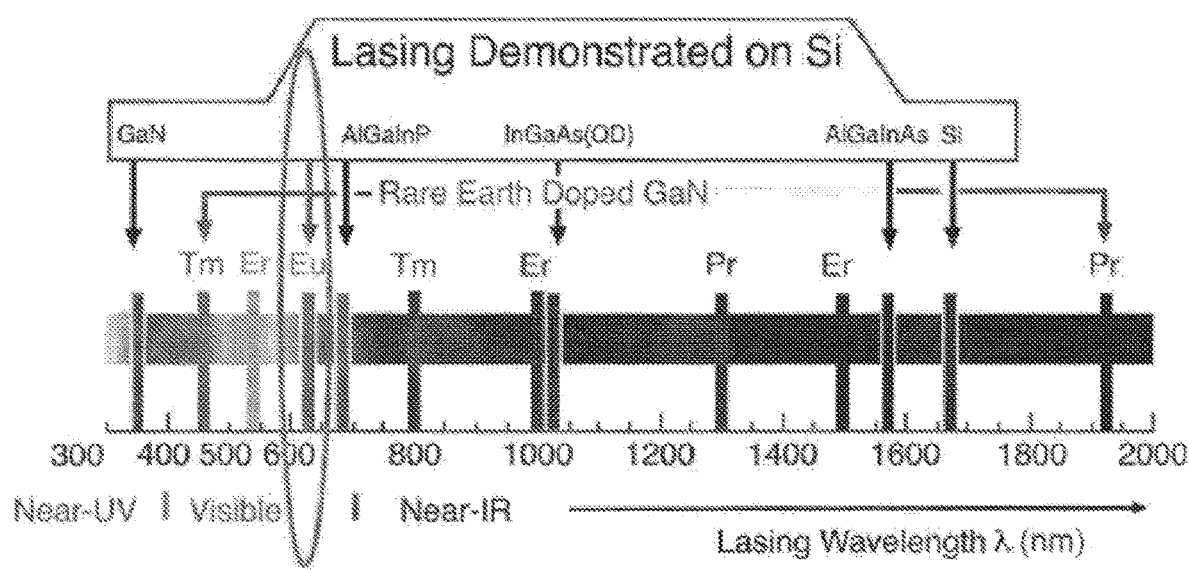
FIG. 11 is an image illustrating an emission wavelength region of GaN according to doping of a rare earth metal.
Figure 12:
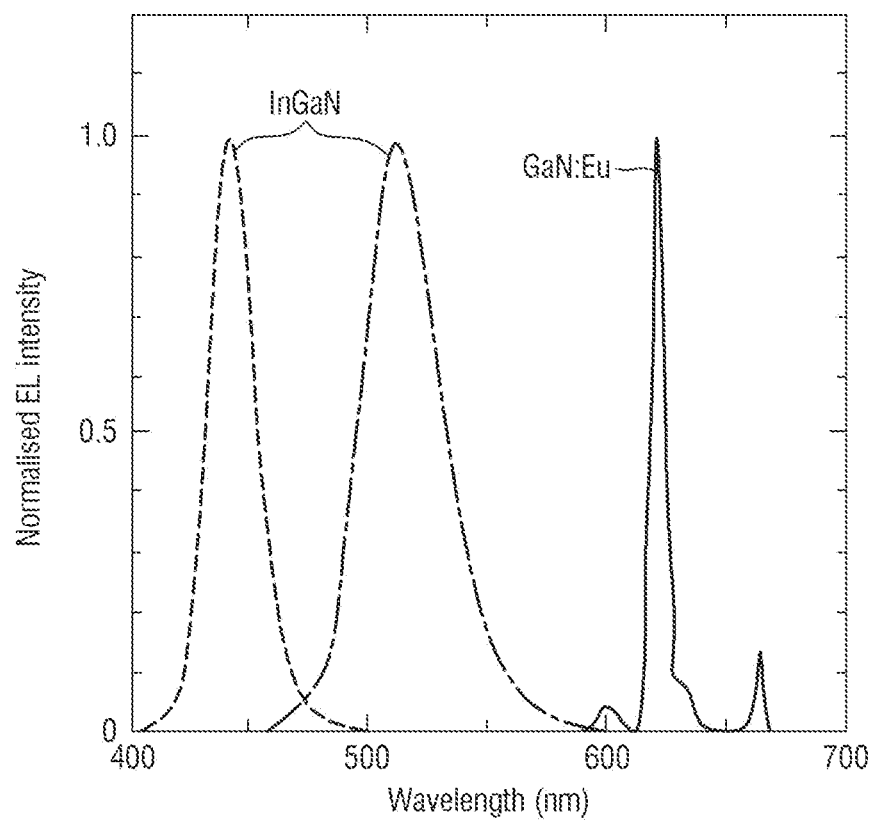
FIG. 12 is a graph illustrating a photoluminescence (PL) spectrum of GaN:Er.
Figure 13:
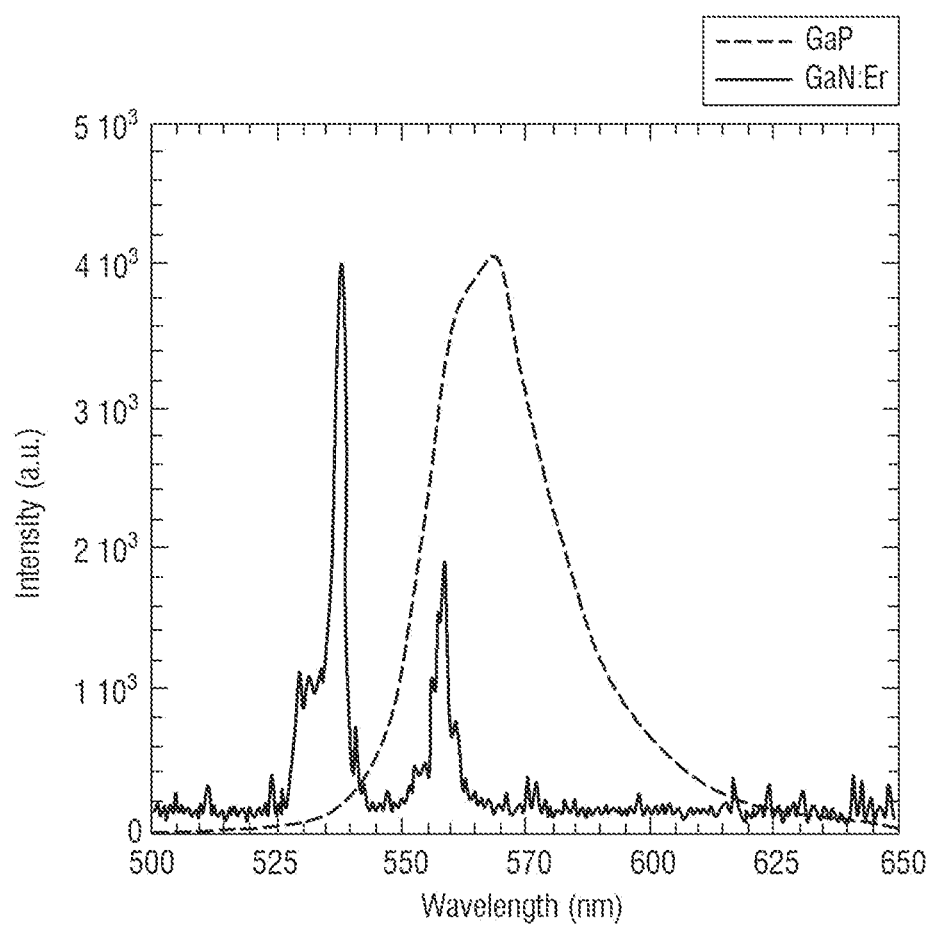
FIG. 13 is a graph illustrating a PL spectrum of GaN:Eu.

FIG. 10 is a schematic view illustrating an energy bandgap of a color conversion layer. FIG. 11 is an image illustrating an emission wavelength region of GaN according to doping of a rare earth metal. FIG. 12 is a graph illustrating a photoluminescence (PL) spectrum of GaN:Er. FIG. 13 is a graph illustrating a PL spectrum of GaN:Eu.

Referring to FIGS. 9 to 12, in each of the first color conversion layer CCL1 and the second color conversion layer CCL2, holes and electrons may form excitons by the energy of the light of the blue wavelength band emitted from the active layer MQW to emit light of other wavelength bands. For example, when the light of the blue wavelength band is irradiated from the active layer MQW of the corresponding light emitting element LE, an electron e receives light energy to be excited from a valence band Ev to a conduction band Ec. In this case, a hole h, which is a vacancy where the electron e disappears, pairs with the electron excited to the conduction band Ec to form an exciton. The exciton loses energy over time to recombine with a hole. In this process, the energy received by the electrons e is again emitted in the form of light to the outside. Here, an emission wavelength of the light is determined according to a size of a bandgap, which is a difference between the valence band Ev and the conduction band Ec.

According to one or more embodiments, when a semiconductor material such as GaN is doped with a rare earth metal, a doping state is formed in the bandgap. For example, the electron e may form a first doping state doping state 1 adjacent to the valence band Ev in the conduction band Ec, and the hole h may form a second doping state doping state 2 adjacent to the conduction band Ec in the valence band Ev. For example, the rare earth metal may form a band gap between the first doping state doping state 1 and the second doping state doping state 2 differently to determine an emission wavelength of the light. Accordingly, erbium (Er) doped in the first color conversion layer CCL1 may emit the light of the green wavelength band, and europium (Eu) doped in the second color conversion layer CCL2 may emit the light of the red wavelength band.

As illustrated in FIGS. 10 to 12, describing an emission wavelength band according to a rare earth element doped in GaN, europium (Eu) may emit the light of the red wavelength band and erbium (Er) may emit the light of the green wavelength band. For example, GaN:Er of the first color conversion layer CCL1 may emit light having a peak wavelength of 537 nm, and GaN:Eu of the second color conversion layer CCL2 may emit light having a peak wavelength of 622 nm.

According to the present embodiments, the second light emitting element LE2 includes the first color conversion layer CCL1 including a semiconductor material doped with erbium (Er), such that the light of the green wavelength band may be emitted from the second light emitting element LE2. The third light emitting element LE3 includes the second color conversion layer CCL2 including a semiconductor material doped with europium (Eu), such that the light of the red wavelength band may be emitted from the third light emitting element LE3. Accordingly, the first light emitting element LE1 emitting (or configured to emit) the light of the blue wavelength band, the second light emitting element LE2 emitting (or configured to emit) the light of the green wavelength band, and the third light emitting element LE3 emitting (or configured to emit) the light of the red wavelength band may be implemented.

The color conversion layers CCL1 and CCL2 described herein may be more advantageous in implementing high resolution than comparable color conversion members such as quantum dots or phosphors. For example, a partition wall for accommodating quantum dots or phosphors is essential (e.g., may be needed), but as resolution increases, it is difficult to form the partition wall in a smaller size. The color conversion layers CCL1 and CCL2 may be manufactured relatively simply by semiconductor growth, such that there is an advantage in implementing high resolution.

InGaN capable of emitting the light of the blue wavelength band (e.g., as in InGaN included in the active layers MQW of the light emitting elements LE) may be formed on the light emitting elements LE as (e.g., in a process similar to) other color conversion members, but InGaN capable of emitting the light of the red or green wavelength band has a growth temperature lower than that of InGaN capable of emitting the light of the blue wavelength band. Accordingly, InGaN of a comparable color conversion member may be damaged due to high heat in a growth process of the active layer MQW emitting (or configured to emit) the light of the blue wavelength band. Because the color conversion layers CCL1 and CCL2 described herein may be formed at a temperature similar to a growth temperature of the active layers MQW, it is possible to prevent or reduce damage to the active layers MQW due to high heat and prevent a decrease in luminous efficiency of the light emitting elements LE.

Referring to FIGS. 4 and 9 again, each light emitting element LE may include a hole HO. The hole HO may allow a first connection electrode CNE1 to be connected to the second semiconductor layer SEM2. The hole HO may penetrate through the first semiconductor layer SEM1, the electron blocking layer EBL, the active layer MQW, and the superlattice layer SLT of each light emitting element LE. The hole HO may be provided at one edge of the light emitting element LE or provided at the center (or substantially at the center) of the light emitting element LE, in plan view.

The light emitting element layer 120 may include the connection electrodes CNE1 and CNE2. The light emitting element layer 120 may include first connection electrodes CNE1 and second connection electrodes CNE2. The first connection electrode CNE1 may connect the second semiconductor layer SEM2 of each light emitting element LE to the corresponding first contact electrode CAE1. The first connection electrode CNE1 may overlap the second semiconductor layer SEM2 and the first contact electrode CAE1, and may be in contact with each of the second semiconductor layer SEM2 and the first contact electrode CAE1. The first connection electrode CNE1 may be in direct contact with the second semiconductor layer SEM2. The first connection electrode CNE1 may supply a cathode voltage to the second semiconductor layer SEM2 so that the active layer MQW of each light emitting element LE may emit the light.

The second connection electrode CNE2 may connect the first semiconductor layer SEM1 of each light emitting element LE to the corresponding second contact electrode CAE2. The second connection electrode CNE2 may overlap the first semiconductor layer SEM1 and the second contact electrode CAE2, and may be in contact with each of the first semiconductor layer SEM1 and the second contact electrode CAE2. The second connection electrode CNE2 may be in direct contact with the first semiconductor layer SEM1 of each light emitting element LE. The second connection electrode CNE2 may supply an anode voltage to the first semiconductor layer SEM1 so that the active layer MQW of each light emitting element LE may emit the light.

Each of the connection electrodes CNE1 and CNE2 may be an ohmic connection electrode. However, the present disclosure is not limited thereto, and each of the connection electrodes CNE1 and CNE2 may also be a Schottky connection electrode. The respective connection electrodes CNE1 and CNE2 may decrease resistance between the respective light emitting elements LE and the contact electrodes CAE1 and CAE2 when the respective light emitting elements LE are electrically connected to the contact electrodes CAE1 and CAE2 in the display device 10 according to one or more embodiments. Each of the connection electrodes CNE1 and CNE2 may include a conductive metal. For example, each of the connection electrodes CNE1 and CNE2 may include at least one selected from gold (Au), copper (Cu), tin (Sn), titanium (Ti), aluminum (Al), and silver (Ag). For example, each of the connection electrodes CNE1 and CNE2 may include an alloy of gold and tin between which a ratio is 9:1, 8:2, or 7:3, and/or include an alloy of copper, silver, and tin (e.g., SAC305).

A distance D1 between the second semiconductor layer SEM2 of each light emitting element LE and the semiconductor circuit substrate 110 may be greater than a distance D2 between the first semiconductor layer SEM1 of each light emitting element LE and the semiconductor circuit substrate 110. Here, the distances between the respective semiconductor layers SEM1 and SEM2 and the semiconductor circuit substrate 110 refer to distances between the respective semiconductor layers SEM1 and SEM2 and the corresponding contact electrodes CAE1 and CAE2 of the semiconductor circuit substrate 110. Accordingly, thicknesses of the connection electrodes CNE1 and CNE2 that are equal to the distances between the respective semiconductor layers SEM1 and SEM2 and the semiconductor circuit substrate 110 may also have a magnitude relationship therebetween. For example, the thickness of the first connection electrode CNE1 may be greater than that of the second connection electrode CNE2.

Hereinafter, processes for manufacturing a display device 10 according to one or more embodiments will be described with reference to other drawings.

Figure 14:
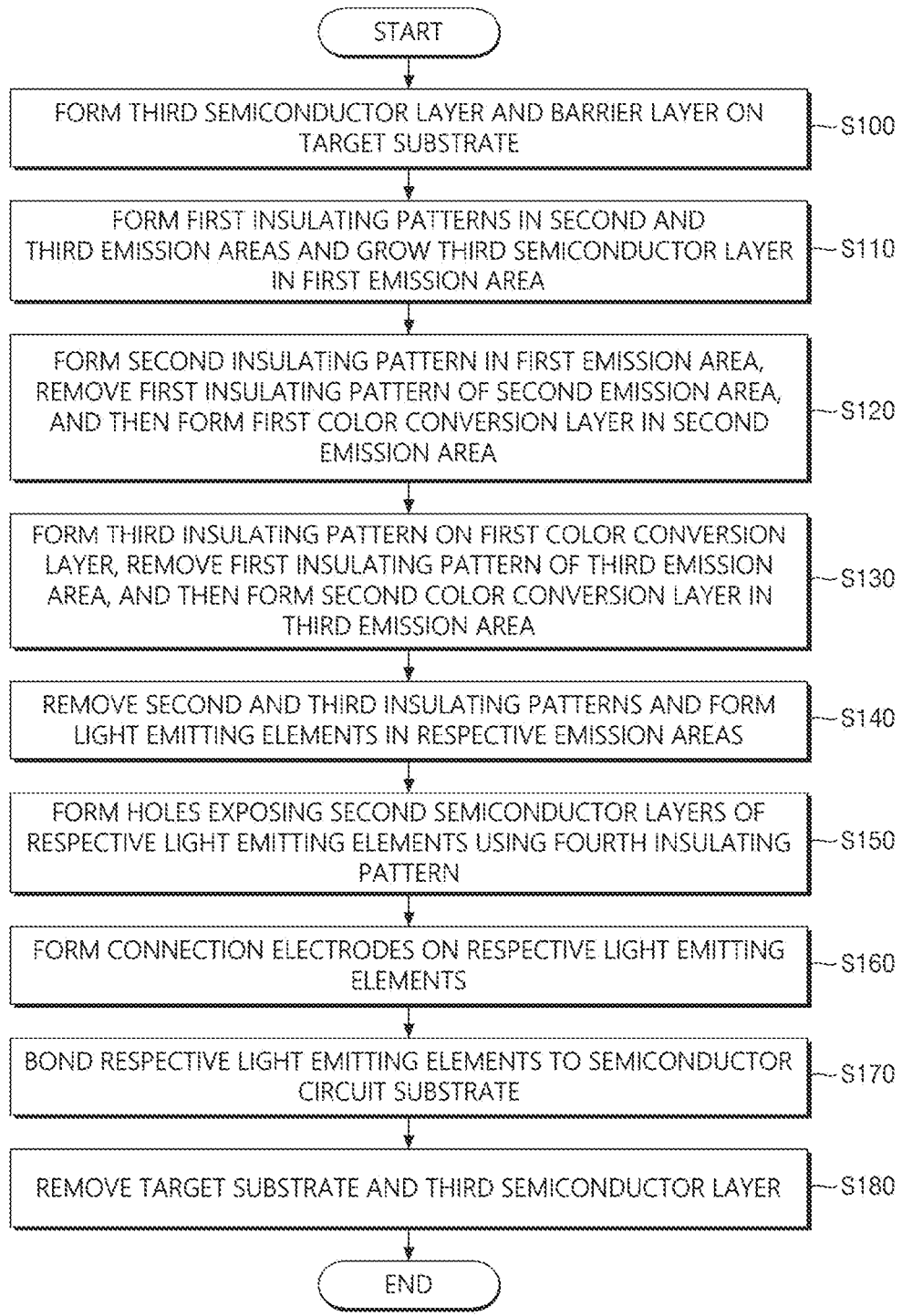
FIG. 14 is a flowchart illustrating a method for manufacturing a display device according to one or more embodiments.

FIG. 14 is a flowchart illustrating a method for manufacturing a display device according to one or more embodiments. FIGS. 15 to 24 are cross-sectional views for describing the method for manufacturing a display device according to one or more embodiments.

FIGS. 15 to 24 illustrate structures according to a formation order of respective layers of the display panel 100 of the display device 1 as cross-sectional views. Processes for manufacturing the light emitting element layer 120 have been mainly illustrated in FIGS. 15 to 24, and these processes may correspond to the cross-sectional view of FIG. 4. Hereinafter, a method for manufacturing a display panel illustrated in FIGS. 15 to 24 will be described in conjunction with FIG. 14.

Figure 15:
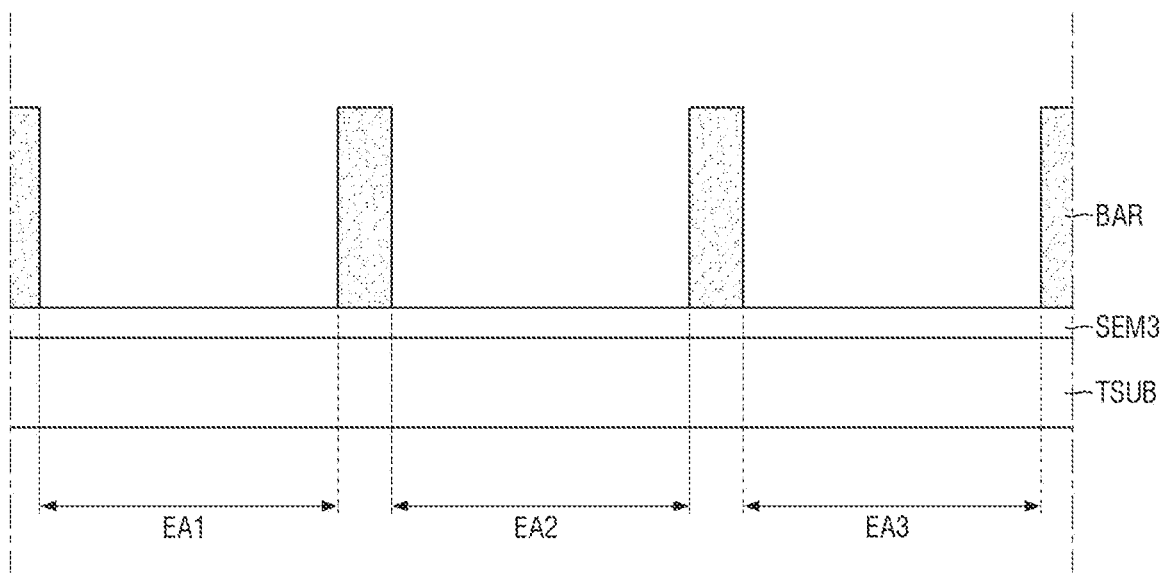

Referring to FIG. 15, a third semiconductor layer SEM3 and a barrier layer BAR are formed on a target substrate TSUB (S100 in FIG. 14).

First, the target substrate TSUB is prepared. The target substrate TSUB may be a sapphire ($Al_2O_3$) substrate. However, the present disclosure is not limited thereto, and a case where the target substrate TSUB is the sapphire substrate will be described by way of example according to one or more embodiments.

The third semiconductor layer SEM3 is formed on the target substrate TSUB. The semiconductor layer SEM3 grown by an epitaxial method may be formed by growing a seed crystal. Here, a method for forming the third semiconductor layer SEM3 may be electron beam deposition, physical vapor deposition (PVD), chemical vapor deposition (CVD), plasma laser deposition (PLD), dual-type thermal evaporation, sputtering, metal organic chemical vapor deposition (MOCVD), and/or the like, and for example, may be metal-organic chemical vapor deposition (MOCVD). However, the present disclosure is not limited thereto.

A precursor material for forming the third semiconductor layer SEM3 is not particularly limited within a range that may be suitably selected for forming a target material. As an example, the precursor material may be a metal precursor including an alkyl group such as a methyl group and/or an ethyl group. For example, the precursor material may be a compound such as trimethyl gallium ($Ga(CH_3)_3$), trimethyl aluminum ($Al(CH_3)_3$), and/or triethyl phosphate (($C_2H_5)_3PO_4$), but is not limited thereto.

In one or more embodiments, the third semiconductor layer SEM3 is formed on the target substrate TSUB. It has been illustrated in the drawings that one third semiconductor layer SEM3 is stacked, but the present disclosure is not limited thereto, and a plurality of third semiconductor layers may also be formed. The third semiconductor layer SEM3 may be provided in order to reduce a difference in lattice constant between a second semiconductor layer SEM2 and the target substrate TSUB. As an example, the third semiconductor layer SEM3 may include an undoped semiconductor, and may be made of a material that is not doped with an n-type or a p-type dopant. In one or more embodiments, the third semiconductor layer SEM3 may be made of at least one selected from undoped InAlGaN, GaN, AlGaN, InGaN, AlN, and InN, but is not limited thereto.

Next, the barrier layer BAR is formed on the third semiconductor layer SEM3. For example, the barrier layer BAR is formed by forming an insulating material layer on the third semiconductor layer SEM3 and patterning the insulating material layer by a photolithography method. The barrier layer BAR may be formed in a lattice shape, and the first emission area EA1, the second emission area EA2, and the third emission area EA3 may be partitioned by the barrier layer BAR. The insulating material layer may be made of an inorganic insulating material such as silicon oxide, silicon nitride, and/or silicon oxynitride.

Next, referring to FIG. 16, first insulating patterns IP1 are formed in the second emission area EA2 and the third emission area EA3, and a third semiconductor layer SEM3 is grown in the first emission area EA1 (S110 in FIG. 14).

In one or more embodiments, the first insulating patterns IP1 are formed by stacking an insulating material layer on the target substrate TSUB on which the barrier layer BAR is formed and patterning the insulating material layer by a photolithography method. The first insulating patterns IP1 may be formed in the second emission area EA2 and the third emission area EA3. For example, the first insulating patterns IP1 are made of a material different from that of the barrier layer BAR to prevent or reduce the removal of the barrier layer BAR when the first insulating patterns IP1 are removed as described in more detail herein below.

Next, the third semiconductor layer SEM3 is further formed on the target substrate TSUB by the epitaxial method described herein. On the third semiconductor layer SEM3 exposed in the first emission area EA1, the third semiconductor layer SEM3 acts as a seed to be further grown. The third semiconductor layer SEM3 is not formed in the second emission area EA2 and the third emission area EA3 masked by the first insulating patterns IP1.

Figure 17:
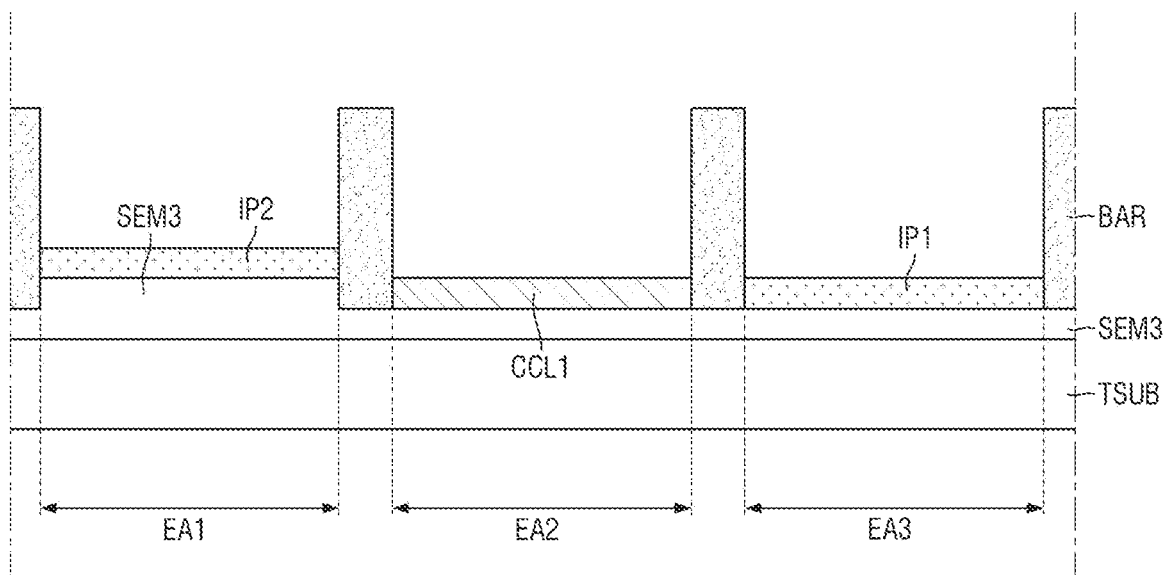

Next, referring to FIG. 17, a second insulating pattern IP2 is formed in the first emission area EA1, the first insulating pattern IP1 of the second emission area EA2 is removed, and a first color conversion layer CCL1 is then formed in the second emission area EA2 (S120 in FIG. 14).

First, the second insulating pattern IP2 is formed in the first emission area EA1. For example, the second insulating pattern IP2 is formed on the third semiconductor layer SEM3 of the first emission area EA1 by forming an insulating material layer on the target substrate TSUB and patterning the insulating material layer by a photolithography method.

Next, the first insulating pattern IP1 formed in the second emission area EA2 is removed by an etching process to expose the third semiconductor layer SEM3 of the second emission area EA2. Then, the first color conversion layer CCL1 is formed on the target substrate TSUB from the third semiconductor layer SEM3 by the epitaxial method described herein. The third semiconductor layer SEM3 acts as a seed on the third semiconductor layer SEM3 exposed in the second emission area EA2, such that the first color conversion layer CCL1 may be grown between the barrier layers BAR. In this case, a dopant may be included in the first color conversion layer CCL1 by flowing a reactive gas as a dopant while growing the first color conversion layer CCL1 by the epitaxial method. The dopant may be the above-described erbium (Er). Accordingly, the first color conversion layer CCL1 may be made of a semiconductor material including an erbium (Er) dopant, for example, GaN:Er. The first color conversion layer CCL1 may be formed up to the same height as the third semiconductor layer SEM3 of the first emission area EA1.

Figure 18:
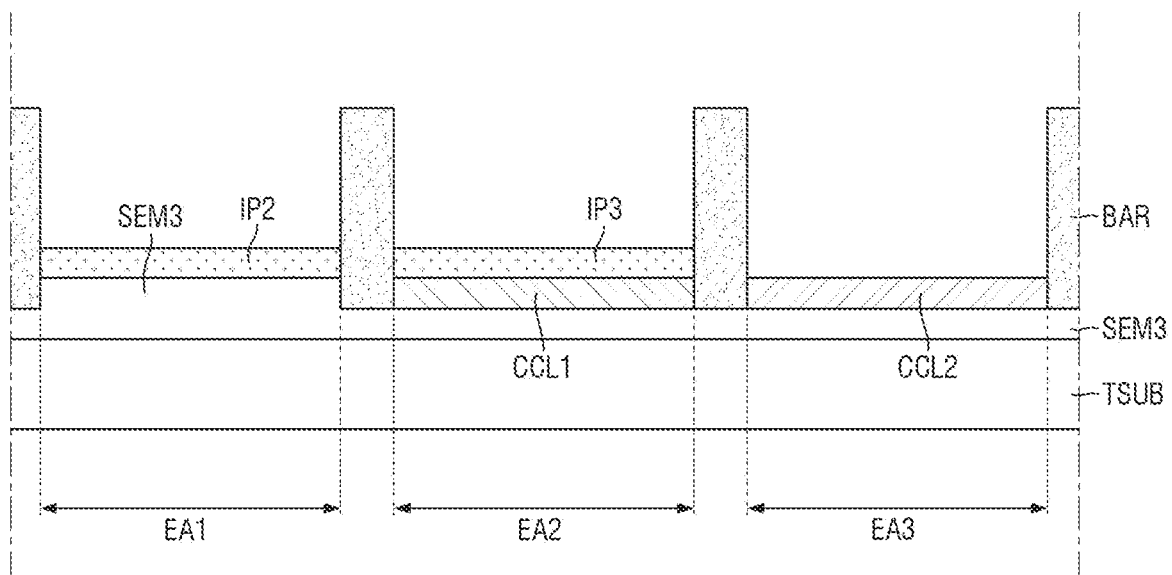

Next, referring to FIG. 18, a third insulating pattern IP3 is formed on the first color conversion layer CCL1, the first insulating pattern IP1 of the third emission area EA3 is removed, and a second color conversion layer CCL2 is then formed in the third emission area EA3 (S130 in FIG. 14).

First, the third insulating pattern IP3 is formed in the second emission area EA2. For example, the third insulating pattern IP3 is formed on the first color conversion layer CCL1 of the second emission area EA2 by forming an insulating material layer on the target substrate TSUB and patterning the insulating material layer by a photolithography method.

Next, the first insulating pattern IP1 formed in the third emission area EA3 is removed by an etching process to expose the third semiconductor layer SEM3 of the third emission area EA3. Then, the second color conversion layer CCL2 is formed on the target substrate TSUB from the third semiconductor layer SEM3 by the epitaxial method described herein. The third semiconductor layer SEM3 acts as a seed on the third semiconductor layer SEM3 exposed in the third emission area EA3, such that the second color conversion layer CCL2 may be grown between the barrier layers BAR. In this case, a dopant may be included in the second color conversion layer CCL2 by flowing a reactive gas as a dopant while growing the second color conversion layer CCL2 by the epitaxial method. The dopant may be the above-described europium (Eu). Accordingly, the second color conversion layer CCL2 may be made of a semiconductor material including a europium (Eu) dopant, for example, GaN:Eu. The second color conversion layer CCL2 may be formed up to the same height as the third semiconductor layer SEM3 of the first emission area EA1 and the first color conversion layer CCL1 of the second emission area EA2.

Figure 19:
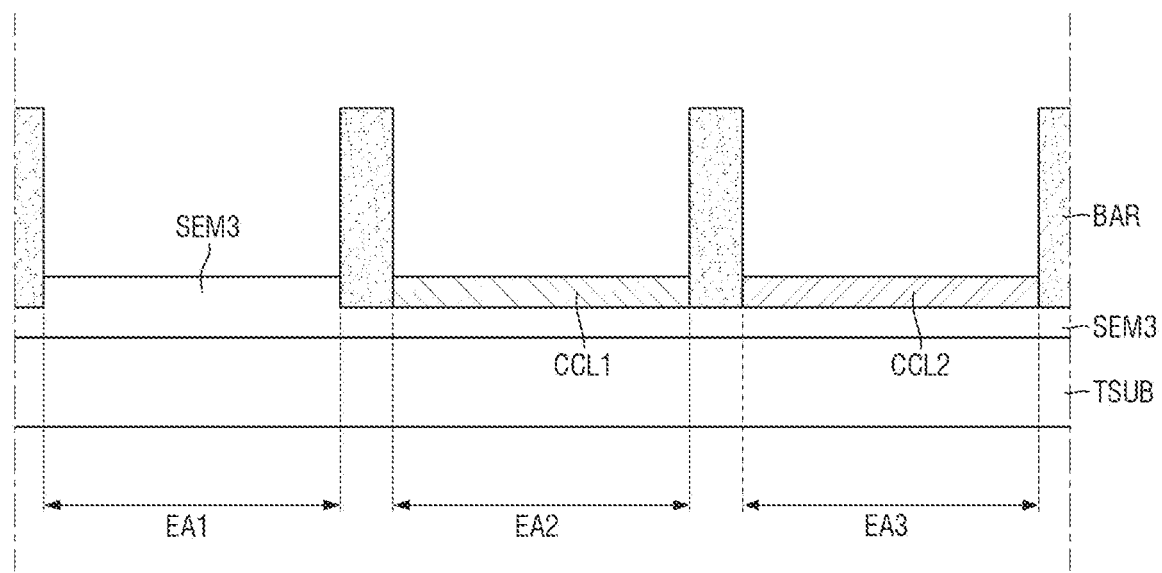
Figure 20:
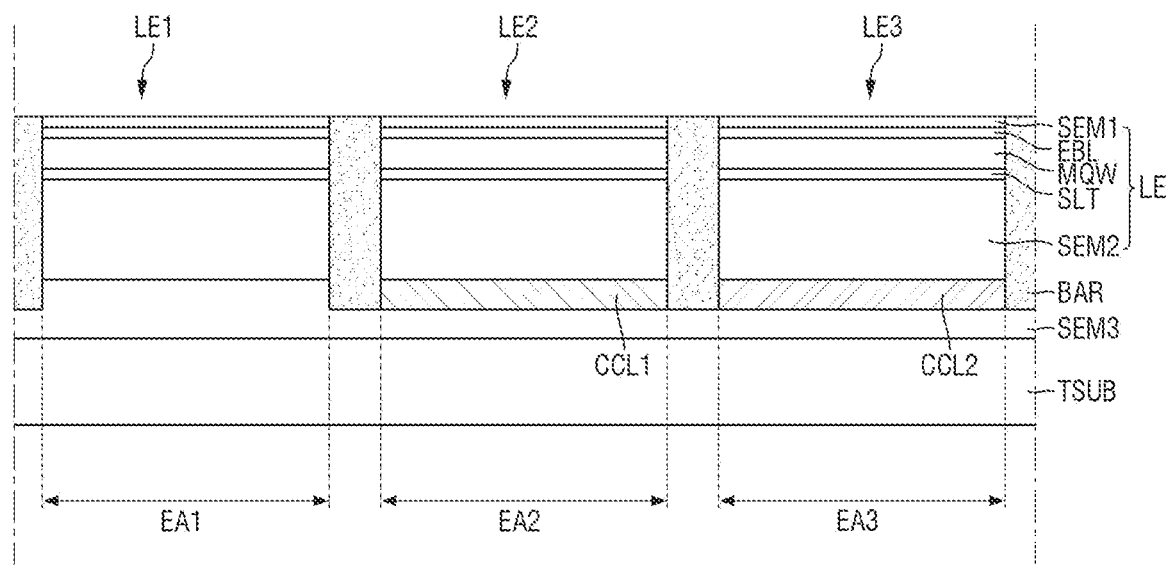

Next, referring to FIGS. 19 and 20, the second insulating pattern IP2 and the third insulating pattern IP3 are removed, and light emitting elements LE are formed in the respective emission areas EA1, EA2, and EA3 (S140 in FIG. 14).

As illustrated in FIG. 19, the second insulating pattern IP2 formed in the first emission area EA1 is removed to expose the third semiconductor layer SEM3. In some embodiments, the third insulating pattern IP3 formed in the second emission area EA2 is removed to expose the first color conversion layer CCL1.

Next, as illustrated in FIG. 20, the light emitting elements LE1, LE2, and LE3 are formed in the first emission area EA1, the second emission area EA2, and the third emission area EA3, respectively. Each of the light emitting elements LE1, LE2, and LE3 are formed by sequentially forming a second semiconductor layer SEM2, a superlattice layer SLT, an active layer MQW, an electron blocking layer EBL, and a first semiconductor layer SEM1 using the epitaxial method described herein. In one or more embodiments, an upper surface of the first semiconductor layer SEM1 of each of the light emitting elements LE1, LE2, and LE3 may be formed to be aligned and coincide with the upper surface of the barrier layer BAR. However, the present disclosure is not limited thereto. Accordingly, a first light emitting element LE1 may be formed in the first emission area EA1, a second light emitting element LE2 may be formed in the second emission area EA2, and a third light emitting element LE3 may be formed in the third emission area EA3.

The active layer MQW included in each of the light emitting elements LE1, LE2, and LE3 may be made of InGaN including about 10% to 15% of indium to emit light of a blue wavelength band. In some embodiments, the first light emitting element LE1 may emit the light of the blue wavelength band of the active layer MQW as it is, the second light emitting element LE2 may convert the light of the blue wavelength band of the active layer MQW into light of a green wavelength band by the first color conversion layer CCL1 and emit the light of the green wavelength band, and the third light emitting element LE3 may convert the light of the blue wavelength band of the active layer MQW into light of a red wavelength band by the second color conversion layer CCL2 and emit the light of the red wavelength band.

Figure 21:
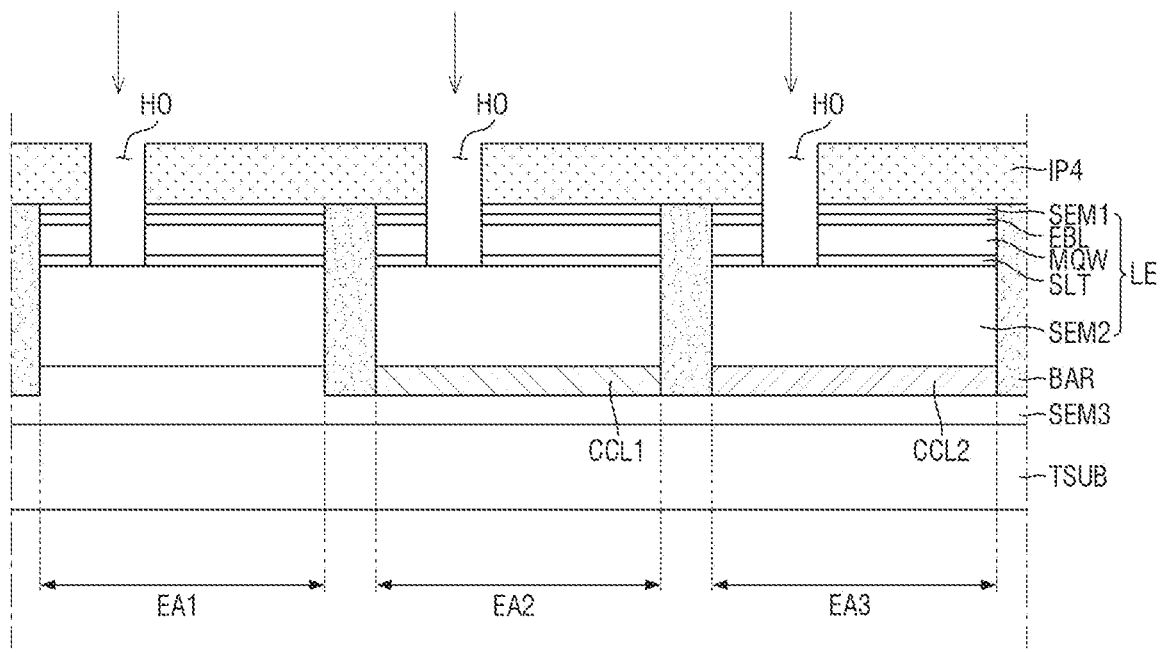

Next, referring to FIG. 21, holes exposing the second semiconductor layers SEM2 of the respective light emitting elements LE1, LE2, and LE3 are formed using a fourth insulating pattern IP4 (S150 in FIG. 14).

For example, the fourth insulating pattern IP4 is formed by forming an insulating material layer on the target substrate TSUB and patterning the insulating material layer using a photolithography method. Next, the holes HO are formed in the respective light emitting elements LE1, LE2, and LE3 using the fourth insulating pattern IP4 as a mask. For example, the holes HO exposing the second semiconductor layers SEM2 are formed by etching the first semiconductor layers SEM1, the electron blocking layers EBL, the active layers MQW, and the superlattice layers SLT of the light emitting elements LE1, LE2, and LE3. The hole HO may be formed at one edge or a center of each of the light emitting elements LE1, LE2, and LE3 in plan view. Thereafter, the fourth insulating pattern IP4 is removed.

Figure 22:
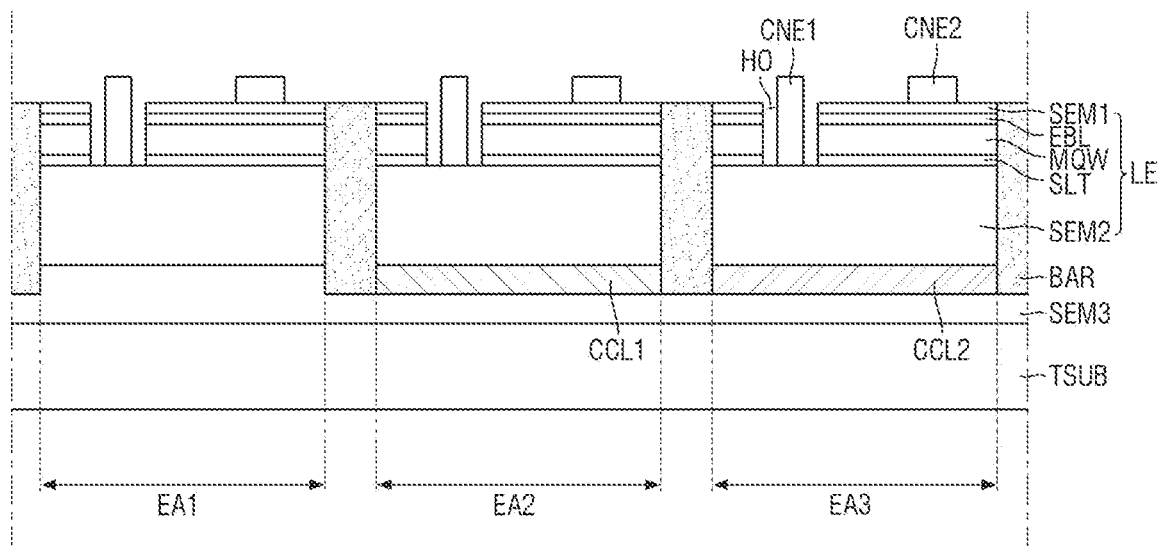

Next, referring to FIG. 22, connection electrodes CNE1 and CNE2 are formed on the respective light emitting elements LE1, LE2, and LE3 (S160 in FIG. 14).

For example, the connection electrodes CNE1 and CNE2 are formed on each of the light emitting elements LE1, LE2, and LE3 by stacking a connection electrode material layer on the target substrate TSUB and patterning the connection electrode material layer by a photolithography method. In each of the light emitting elements LE1, LE2, and LE3, a first connection electrode CNE1 is directly formed on the second semiconductor layer SEM2 through the hole HO. A second connection electrode CNE2 is directly formed on the first semiconductor layer SEM1 in each of the light emitting elements LE1, LE2, and LE3. Accordingly, a light emitting element layer in which a plurality of light emitting elements LE1, LE2, and LE3 and connection electrodes CNE1 and CNE2 are formed is formed on the target substrate TSUB.

Figure 23:
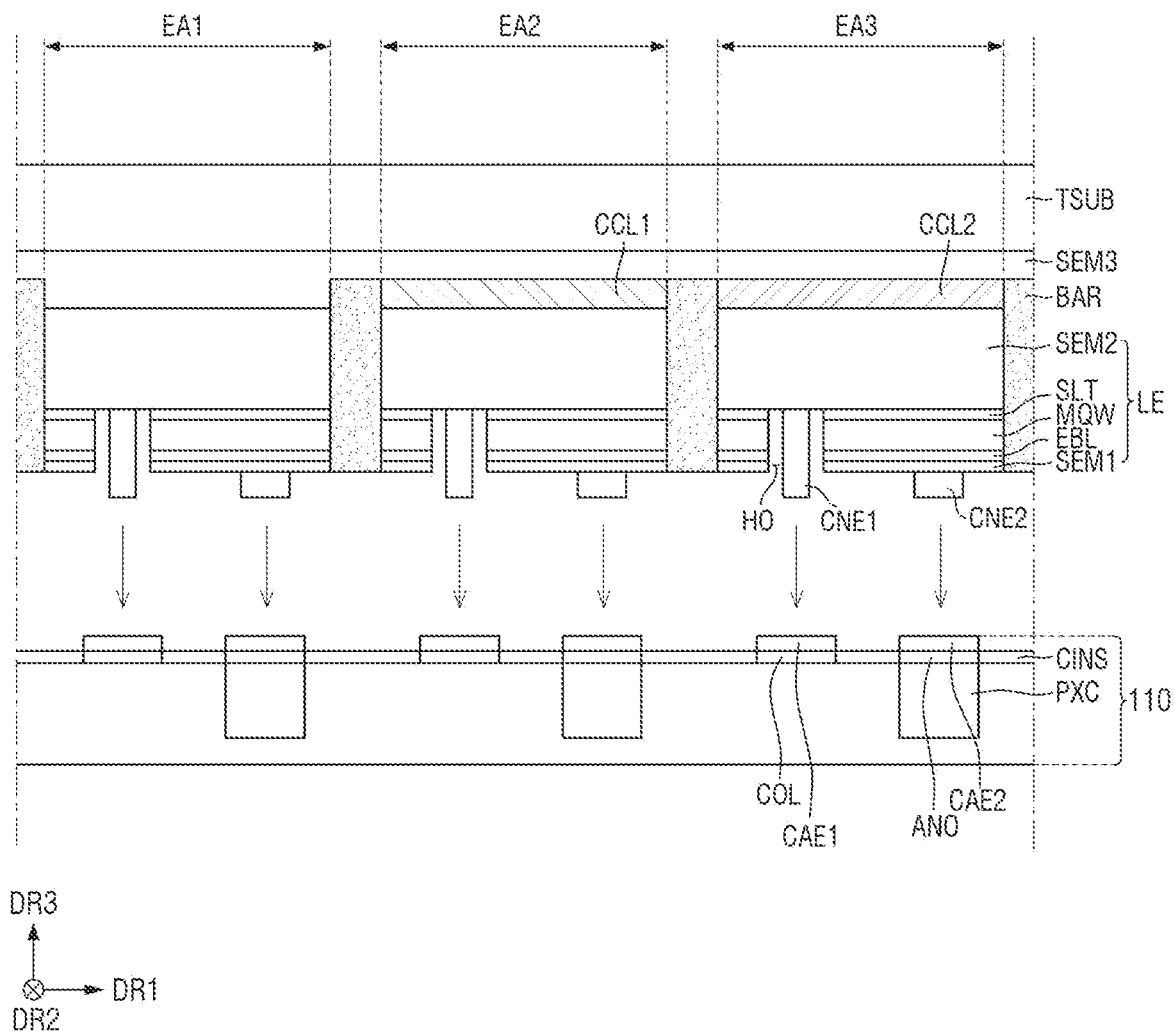

Next, referring to FIG. 23, the respective light emitting elements LE1, LE2, and LE3 are bonded to a semiconductor circuit substrate 110 (S170 in FIG. 14).

First, the semiconductor circuit substrate 110 is prepared. The semiconductor circuit substrate 110 may include pixel circuit units PXC, pixel electrodes ANO, common lines COL, and first and second contact electrodes CAE1 and CAE2.

For example, the pixel electrodes ANO and the common lines COL are formed on the semiconductor circuit substrate 110 on which the pixel circuit units PXC are formed, and a circuit insulating layer CINS for planarizing a step of the pixel electrodes ANO and the common lines COL is formed.

Then, the contact electrodes CAE1 and CAE2 are formed by stacking a contact electrode material layer on the pixel electrodes ANO and the common lines COL and etching the contact electrode material layer. The contact electrode material layer may include gold (Au), copper (Cu), aluminum (Al), and/or tin (Sn).

Next, the target substrate TSUB is aligned on the semiconductor circuit substrate 110. Alignment keys may be provided on the semiconductor circuit substrate 110 and the target substrate TSUB, respectively, and the semiconductor circuit substrate 110 and the target board TSUB may be aligned with each other through the alignment keys. Next, the semiconductor circuit substrate 110 and the target substrate TSUB are bonded to each other.

For example, the contact electrodes CAE1 and CAE2 of the semiconductor circuit substrate 110 and the connection electrodes CNE1 and CNE2 of the respective light emitting elements LE1, LE2 and LE3 are brought into contact with each other. The first contact electrode CAE1 is in contact with the first connection electrode CNE1, and the second contact electrode CAE2 is in contact with the second connection electrode CNE2. Next, the respective light emitting elements LE1, LE2, and LE3 are bonded to the semiconductor circuit substrate 110 by fusion-bonding the contact electrodes CAE1 and CAE2 and the connection electrodes CNE1 and CNE2 respectively to each other at a set or predetermined temperature.

Figure 24:
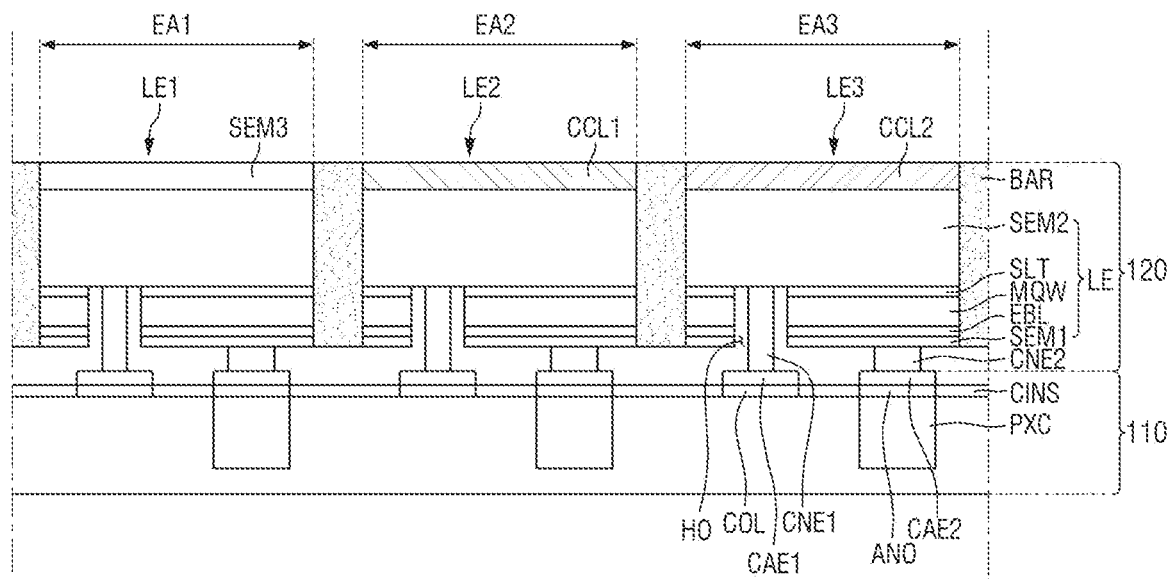

Next, referring to FIG. 24, a display panel is manufactured by removing the target substrate TSUB and the third semiconductor layer SEM3 (S180 in FIG. 14).

For example, the target substrate TSUB is separated from the third semiconductor layer SEM3. A process for separating the target substrate TSUB may be a laser lift off (LLO) process. The laser lift-off process uses a laser, and may use a KrF excimer laser (wavelength of 248 nm) as a source. An energy density of the excimer laser may be in the range of approximately 550 mJ/cm$^2$ to 950 mJ/cm$^2$, and an incident area of the excimer laser may be in the range of 50×50 μm$^2$ to 1×1 cm$^2$, but the present disclosure is not limited thereto.

Next, the third semiconductor layer SEM3 may be removed through a polishing process such as a chemical mechanical polishing (CMP) process and/or an etching process. In some embodiments, the third semiconductor layer SEM3 may be removed through a polishing process such as a CMP process or may be removed by wet etching or dry etching. The third semiconductor layer SEM3 is polished and/or etched up to a surface of the barrier layer BAR, such that the third semiconductor layer SEM3 does not remain in the second light emitting element LE2 and the third light emitting element LE3 and remains in the first light emitting element LE1.

As described herein, according to one or more embodiments, it is possible to emit the light of the blue wavelength band, the light of the green wavelength band, and the light of the red wavelength band by forming the first color conversion layer CCL1 on the second light emitting element LE2 of the light emitting elements LE1, LE2, and LE3 and forming the second color conversion layer CCL2 on the third light emitting element LE3 of the light emitting elements LE1, LE2, and LE3. In some embodiments, by forming the color conversion layers CCL1 and CCL2 using a growth process of the light emitting elements, it is possible to simplify a process and prevent or reduce damage to the light emitting elements due to high heat and to prevent or reduce a decrease in luminous efficiency.

Figure 25:
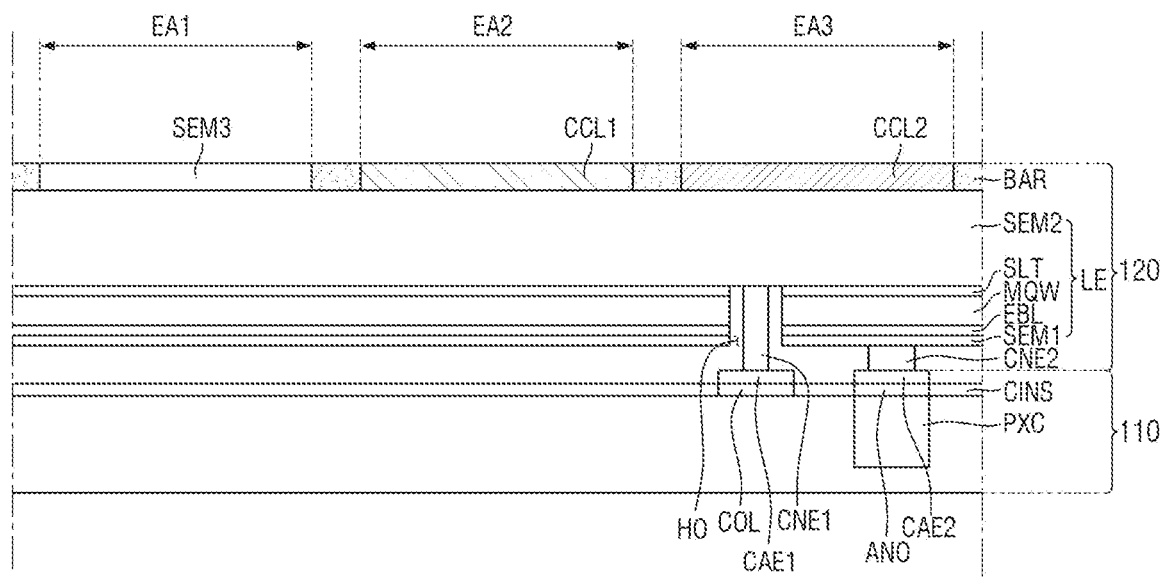
FIG. 25 is a plan view illustrating a partial area of a display panel of a display device according to one or more embodiments.

FIG. 25 is a plan view illustrating a partial area of a display panel of a display device according to one or more embodiments.

A display device according to the embodiments of FIG. 25 is different from the display device according to the embodiments described herein with reference to FIG. 4 in that the barrier layer BAR is formed at the same layer as the color conversion layers CCL1 and CCL2 and the third semiconductor layer SEM (e.g., the barrier layer BAR has the same thickness as and is aligned with the color conversion layers CCL1 and CCL2 and the third semiconductor layer SEM) and it is a display device emitting (or configured to emit) white light. Contents different from those of one or more embodiments described above will be mainly described.

Referring to FIG. 25, the light emitting element layer 120 may include light emitting elements LE, each including a first semiconductor layer SEM1, an electron blocking layer EBL, an active layer MQW, a superlattice layer SLT, and a second semiconductor layer SEM2. The light emitting element LE may be partitioned into a first emission area EA1, a second emission area EA2, and a third emission area EA3 by the barrier layer BAR. The first semiconductor layers SEM1, the electron blocking layers EBL, the active layers MQW, the superlattice layers SLT, and the second semiconductor layers SEM2 of the light emitting elements LE may be distinguished from each other using the first emission area EA1, the second emission area EA2, and the third emission area EA3 as one unit. For example, one light emitting element LE may include the first emission area EA1, the second emission area EA2, and the third emission area EA3, and may be partitioned between adjacent light emitting elements LE through patterning. However, the present disclosure is not limited thereto, and the second semiconductor layer SEM2 may also be formed continuously between the respective light emitting elements LE.

The light emitting element LE may include a hole HO penetrating through the first semiconductor layer SEM1, the electron blocking layer EBL, the active layer MQW, and the superlattice layer SLT. The hole HO may expose the second semiconductor layer SEM2, and the first connection electrode CNE1 may be connected to the first contact electrode CAE1 of the semiconductor circuit substrate 110 through the hole HO. In some embodiments, the second connection electrode CNE2 formed on the first semiconductor layer SEM1 may be connected to the first contact electrode CAE2.

The barrier layer BAR may be provided on the second semiconductor layer SEM2 of the light emitting element LE to partition the first emission area EA1, the second emission area EA2, and the third emission area EA3. A third semiconductor layer SEM3 may be provided on the second semiconductor layer SEM2 of the first emission area EA1, a first color conversion layer CCL1 may be provided on the second semiconductor layer SEM2 of the second emission area EA2, and a second color conversion layer CCL2 may be provided on the second semiconductor layer SEM2 of the third emission area EA3.

According to the present embodiments, the active layer MQW of the light emitting element LE may emit light of a blue wavelength band. The light of the blue wavelength band emitted from the active layer MQW is emitted to the first emission area EA1, the second emission area EA2, and the third emission area EA3. In the first emission area EA1, the light of the blue wavelength band is transmitted through the third semiconductor layer SEM3 and is emitted as it is. In the second emission area EA2, the first color conversion layer CCL1 including a semiconductor material doped with erbium (Er) is included, such that the light of the blue wavelength band may be converted into light of a green wavelength band and the light of the green wavelength band may be emitted. In the third emission area EA3, the second color conversion layer CCL2 including a semiconductor material doped with europium (Eu) is included, such that the light of the blue wavelength band may be converted into light of a red wavelength band and the light of the red wavelength band may be emitted. Accordingly, the light of the blue wavelength band, the light of the green wavelength band, and the light of the red wavelength band may be simultaneously (or concurrently) emitted from the light emitting element layer 120, such that white may be implemented.

Figure 26:
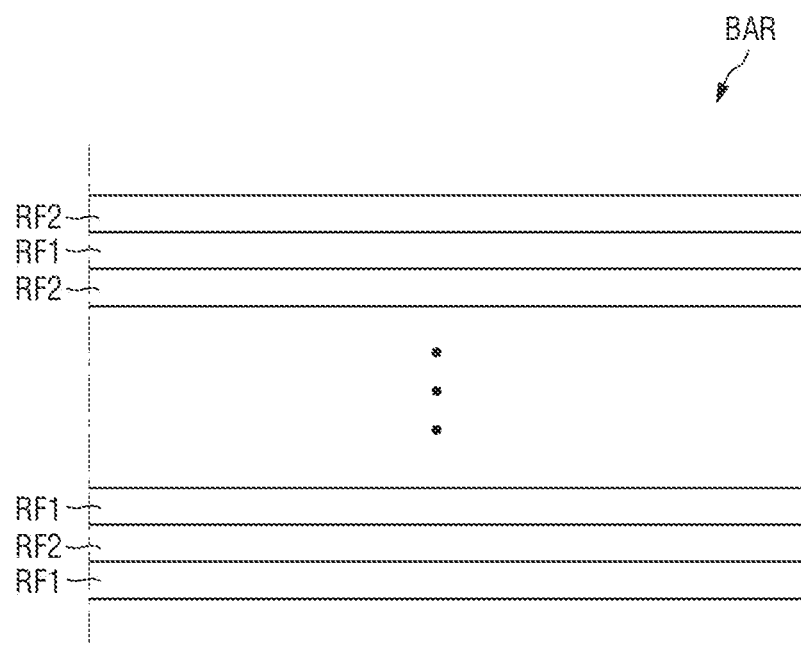
FIG. 26 is a schematic cross-sectional view illustrating a barrier layer according to one or more embodiments.

FIG. 26 is a schematic cross-sectional view illustrating a barrier layer according to one or more embodiments.

Referring to FIG. 26, the barrier layer BAR disclosed in embodiments of FIGS. 4 and 25 described above may be an omni directional reflective (ODR) layer. When the light emitted from the active layer MQW of the light emitting element LE reaches the ODR layer, an amount of light reflected by the ODR layer is larger than an amount of light absorbed by the ODR layer, such that a larger amount of light may be emitted to the outside. Accordingly, color mixing between adjacent light emitting elements LE may be prevented or reduced and luminance may be improved.

According to one or more embodiments, first reflective layers RF1 and second reflective layers RF2 may be stacked alternately with each other in the barrier layer BAR. The first reflective layer RF1 may include silicon oxide ($SiO_x$) having a refractive index of 1.54 to 1.55, and the second reflective layer RF2 may include titanium oxide ($TiO_x$) having a refractive index greater than that of the second reflective layer RF2. For example, the titanium oxide may have a refractive index of 2.36 to 2.48.

In a case where the light emitted from the active layer MQW is incident on the barrier layer BAR with a set or predetermined critical angle, when the light is incident from the second reflective layer RF2 to the first reflective layer RF1 while being refracted, for example, when the light is incident from a medium having a large refractive index to a medium having a small refractive index, reflectivity increases to about 95%. In this case, in order to improve the reflectivity, a thickness of the first reflective layer RF1 may be 1.5 to 1.7 times the thickness of the second reflective layer RF2 (e.g., the thickness of the first reflective layer RF1 may be 1.5 to 1.7 larger than the thickness of the second reflective layer RF2). However, the present disclosure is not limited thereto.

Figure 27:
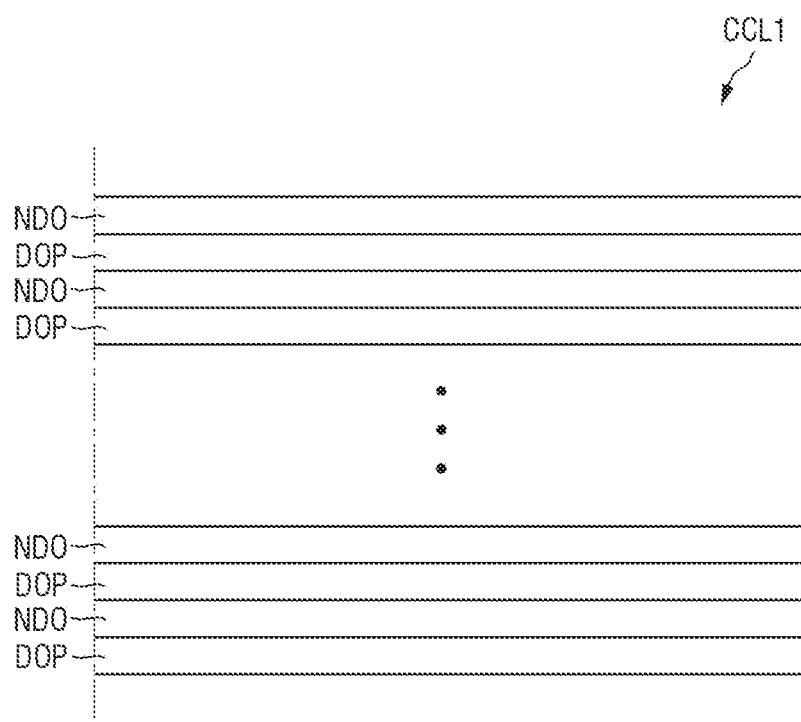
FIG. 27 is a schematic cross-sectional view illustrating a color conversion layer according to one or more embodiments.

FIG. 27 is a schematic cross-sectional view illustrating a color conversion layer according to one or more embodiments.

Referring to FIG. 27, unlike the respective color conversion layers CCL1 and CCL2 formed as a single layer as disclosed in embodiments of FIGS. 4 and 25 described above, the respective color conversion layers CCL1 and CCL2 may be formed as multiple layers. Hereinafter, the first color conversion layer CCL1 will be described by way of example, but the following description may also be applied to the second color conversion layer CCL2.

The first color conversion layer CCL1 may include a multiple quantum well structure, and may have a structure in which a plurality of well layers and barrier layers are alternately stacked. For example, first conversion layers DOP and second conversion layers NDO may be stacked alternately with each other in the first color conversion layer CCL1, the first conversion layers DOP may act as well layers and the second conversion layers NDO may act as barrier layers. In the multiple quantum well structure, the number of carriers generated per unit time is increased by an increase in current, such that a recombination is further increased, and luminous efficiency may thus be improved.

According to one or more embodiments, the first conversion layer DOP may include a semiconductor material having a chemical formula of $Al_xGa_yIn_{1-x-y}N$ ($0 \leq x \leq 1$, $0 \leq y \leq 1$, and $0 \leq x+y \leq 1$) and doped with an erbium (Er) dopant. The second conversion layer NDO may include a semiconductor material having a chemical formula of $Al_xGa_yIn_{1-x-y}N$ ($0 \leq x \leq 1$, $0 \leq y \leq 1$, and $0 \leq x+y \leq 1$) and not doped with a dopant. In one or more embodiments, the first conversion layer DOP may be made of GaN:Er and the second conversion layer NDO may be made of GaN, but the present disclosure is not limited thereto. In a case of the second color conversion layer CCL2, a first conversion layer may be made of GaN:Eu and the second conversion layer may be made of GaN. In some embodiments, a thickness of the first conversion layer DOP may be approximately 1 to 4 nm, and a thickness of the second conversion layer NDO may be approximately 3 nm to 10 nm.

FIGS. 28 to 32 are layout diagrams illustrating another example of area A of FIG. 1 in more detail. FIG. 33 is a cross-sectional view illustrating an example of the display panel taken along line D-D' of FIG. 28.

Referring to FIGS. 28 and 33, the embodiment of FIGS. 28 to 33 is different from the embodiments of FIGS. 2 and 3 described above in that it further includes a fourth light emitting element LE4 emitting (or configured to emit) the same second light as the second light emitting element LE2 and respective emission areas EA1, EA2, EA3, and EA4 are provided in a PENTILE® structure (PENTILE® is a registered trademark owned by Samsung Display Co., Ltd). Hereinafter, a description of contents overlapping those of one or more embodiments of FIGS. 2 and 3 will not be provided (e.g., will be omitted).

Referring to FIGS. 28 and 33, each of a plurality of pixels PX may include a first light emitting element LE1 emitting (or configured to emit) first light, a second light emitting element LE2 emitting (or configured to emit) second light, a third light emitting element LE3 emitting (or configured to emit) third light, and a fourth light emitting element LE4 emitting (or configured to emit) the second light.

In the display area DA, the first light emitting elements LE1 and the third light emitting elements LE3 may be provided alternately with each other in the first direction DR1. The second light emitting elements LE2 and the fourth light emitting elements LE4 may be provided alternately with each other in the first direction DR1. The first light emitting elements LE1, the second light emitting elements LE2, the third light emitting elements LE3, and the fourth light emitting elements LE4 may be alternately provided in a first diagonal direction DD1 and a second diagonal direction DD2. The first diagonal direction DD1 may be a diagonal direction between the first and second directions DR1 and DR2, and the second diagonal direction DD2 may be a direction orthogonal to the first diagonal direction DD1.

In each of the plurality of pixels PX, the first light emitting element LE1 and the third light emitting element LE3 may be provided in the first direction DR1, and the second light emitting element LE2 and the fourth light emitting element LE 4 may be provided in the first direction DR1. In each of the plurality of pixels PX, the first light emitting element LE1 and the second light emitting element LE2 may be provided in the first diagonal direction DD1, the second light emitting element LE2 and the third light emitting element LE3 may be provided in the second diagonal direction DD2, and the third light emitting element LE3 and the fourth light emitting elements LE4 may be provided in the first diagonal direction DD1.

The fourth light emitting element LE4 may be substantially the same as the second light emitting element LE2. For example, the fourth light emitting element LE4 may emit the second light and may have the same structure as the second light emitting element LE2.

The first light emitting element LE1 may be provided in a first emission area EA1, the second light emitting element LE2 may be provided in a second emission area EA2, the third light emitting element LE3 may be provided in a third emission area EA3, and the fourth light emitting element LE4 may be provided in a fourth emission area EA4.

An area of the first emission area EA1, an area of the second emission area EA2, an area of the third emission area EA3, and an area of the fourth emission area EA4 may be substantially the same as each other, but one or more embodiments of the present disclosure is not limited thereto. For example, an area of the first emission area EA1, an area of the second emission area EA2, and an area of the third emission area EA3 may be different from each other, and the area of the second emission area EA2 may be the same as an area of the fourth light emission area EA4.

In some embodiments, a distance between the first emission area EA1 and the second emission area EA2 neighboring to each other, a distance between the second emission area EA2 and the third emission area EA3 neighboring to each other, a distance between the first emission area EA1 and the fourth emission area EA4 neighboring to each other, and a distance between the third emission area EA3 and the fourth emission area EA4 neighboring to each other may be substantially the same as each other, but one or more embodiments of the present disclosure is not limited thereto. For example, a distance between the first emission area EA1 and the second emission area EA2 neighboring to each other and a distance between the second emission area EA2 and the third emission area EA3 neighboring to each other may be different from each other, and a distance between the first emission area EA1 and the fourth emission area EA4 neighboring to each other and a distance between the third emission area EA3 and the fourth emission area EA4 neighboring to each other may be different from each other. In this case, the distance between the first emission area EA1 and the second emission area EA2 neighboring to each other and the distance between the first emission area EA1 and the fourth emission area EA4 neighboring to each other may be substantially the same as each other, and the distance between the second emission area EA2 and the third emission area EA3 neighboring to each other and the distance between the third emission area EA3 and the fourth emission area EA4 neighboring to each other may be substantially the same as each other.

Referring to FIG. 29, in a display device 10 according to one or more embodiments, each of a plurality of pixels PX may include four light emitting elements LE1, LE2, LE3, and LE4, a plurality of light emitting elements LE1, LE2, LE3, and LE4 may be arranged to be spaced apart from each other in the first direction DR1 and the second direction DR2, and elements spaced apart from each other so as to be most adjacent to each other may be spaced apart from each other in diagonal directions DD1 and DD2 between the first direction DR1 and the second direction DR2.

In one or more embodiments, a first light emitting element LE1, a second light emitting element LE2, a third light emitting element LE3, and a fourth light emitting element LE4 may have the same diameter. For example, a first diameter WE1 of the first light emitting element LE1, a second diameter WE2 of the second light emitting element LE2, a third diameter WE3 of the third light emitting element LE3, and a fourth diameter WE4 of the fourth light emitting element LE4 may be the same as each other. However, the present disclosure is not limited thereto. In some embodiments, diameters of the light emitting elements LE1, LE2, LE3, and LE4 may also be different from each other.

Intervals DA1 and DA3 between the second light emitting element LE2 and the fourth light emitting element LE4 adjacent to each other may be the same as intervals DA2 and DA4 between the first light emitting element LE1 and the third light emitting element LE3 adjacent to each other. For example, a first interval DA1 between the second light emitting element LE2 and the fourth light emitting element LE4 adjacent to each other in the first direction DR1 may be the same as a second interval DA2 between the first light emitting element LE1 and the third light emitting element LE3 adjacent to each other in the first direction DR1. A third interval DA3 between the second light emitting element LE2 and the fourth light emitting element LE4 adjacent to each other in the second direction DR2 may be the same as a fourth interval DA4 between the first light emitting element LE1 and the third light emitting element LE3 adjacent to each other in the second direction DR2. In some embodiments, a first diagonal interval DG1 between the first light emitting element LE1 and the second light emitting element LE2 adjacent to each other in the first diagonal direction DD1 may be the same as a second diagonal interval DG2 between the third light emitting element LE3 and the fourth light emitting element LE4 adjacent to each other in the first diagonal direction DD1. A third diagonal interval DG3 between the second light emitting element LE2 and the third light emitting element LE3 adjacent to each other in the second diagonal direction DD2 may be the same as a fourth diagonal interval DG4 between the first light emitting element LE1 and the fourth light emitting element LE4 adjacent to each other in the second diagonal direction DD2. However, the present disclosure is not limited thereto. The intervals between the light emitting elements LE adjacent to each other may be changed depending on an arrangement, diameters, and/or the like, of the light emitting elements LE.

In FIG. 29, the intervals DA1 to DA4 and DG1 to DG4 between the first to fourth light emitting elements LE1, LE2, LE3, and LE4 have been illustrated based on outer side portions (e.g., peripheral circumferences) of the respective light emitting elements LE1, LE2, LE3, and LE4. However, the present disclosure is not limited thereto. The intervals DA1 to DA4 and DG1 to DG4 between the light emitting elements LE1, LE2, LE3, and LE4 may also be illustrated based on the centers of the light emitting elements LE1, LE2, LE3, and LE4.

Referring to FIG. 30, intervals DA1 and DA3 between centers of the second light emitting element LE2 and the fourth light emitting element LE4 adjacent to each other may be the same as intervals DA2 and DA4 between centers of the first light emitting element LE1 and the third light emitting element LE3 adjacent to each other. For example, a first interval DA1 between centers of the second light emitting element LE2 and the fourth light emitting element LE4 adjacent to each other in the first direction DR1 may be the same as a second interval DA2 between centers of the first light emitting element LE1 and the third light emitting element LE3 adjacent to each other in the first direction DR1. A third interval DA3 between centers of the second light emitting element LE2 and the fourth light emitting element LE4 adjacent to each other in the second direction DR2 may be the same as a fourth interval DA4 between centers of the first light emitting element LE1 and the third light emitting element LE3 adjacent to each other in the second direction DR2. In some embodiments, a first diagonal interval DG1 between centers of the first light emitting element LE1 and the second light emitting element LE2 adjacent to each other in the first diagonal direction DD1 may be the same as a second diagonal interval DG2 between centers of the third light emitting element LE3 and the fourth light emitting element LE4 adjacent to each other in the first diagonal direction DD1. A third diagonal interval DG3 between centers of the second light emitting element LE2 and the third light emitting element LE3 adjacent to each other in the second diagonal direction DD2 may be the same as a fourth diagonal interval DG4 between centers of the first light emitting element LE1 and the fourth light emitting element LE4 adjacent to each other in the second diagonal direction DD2.

A case where the intervals DA1 to DA4 and DG1 to DG4 between the centers of the light emitting elements LE1, LE2, LE3, and LE4 are the same as each other has been illustrated in the present embodiment, but the present disclosure is not limited thereto. The intervals between the centers of the light emitting elements LE1, LE2, LE3, and LE4 may also be modified as described above with reference to one or more embodiments of FIG. 29.

Figure 31:
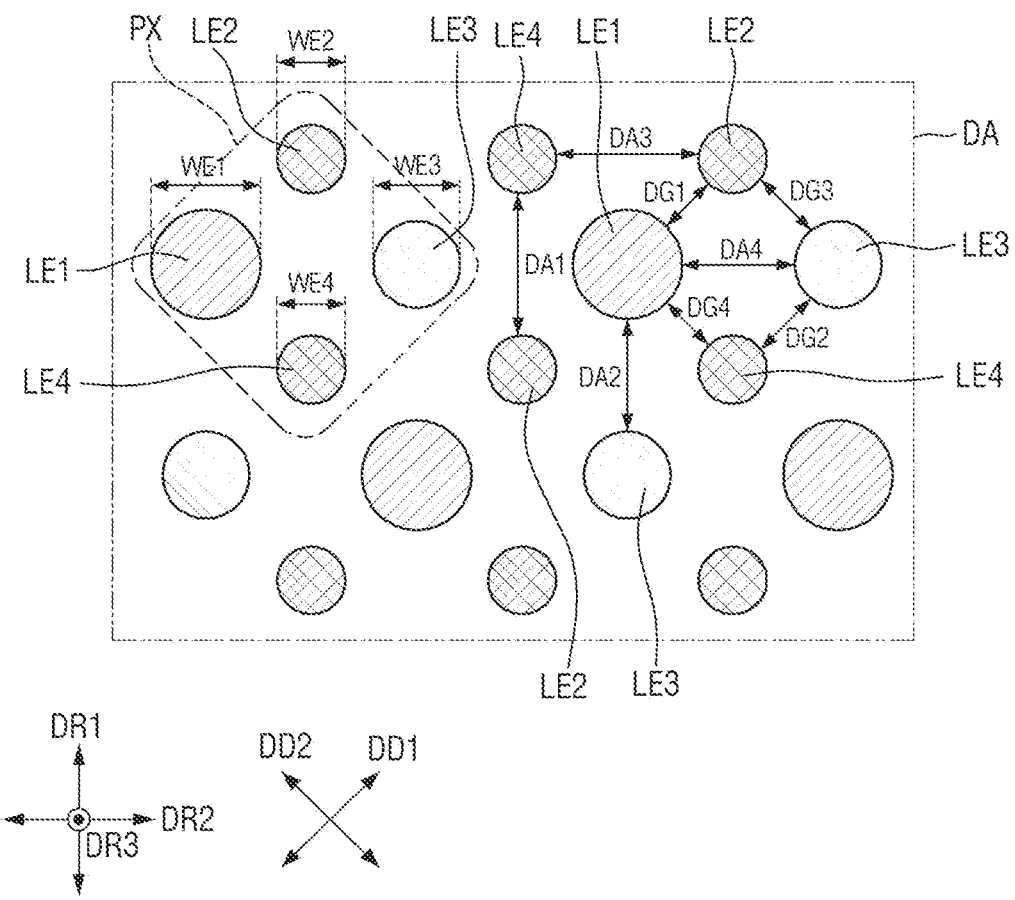
Figure 32:
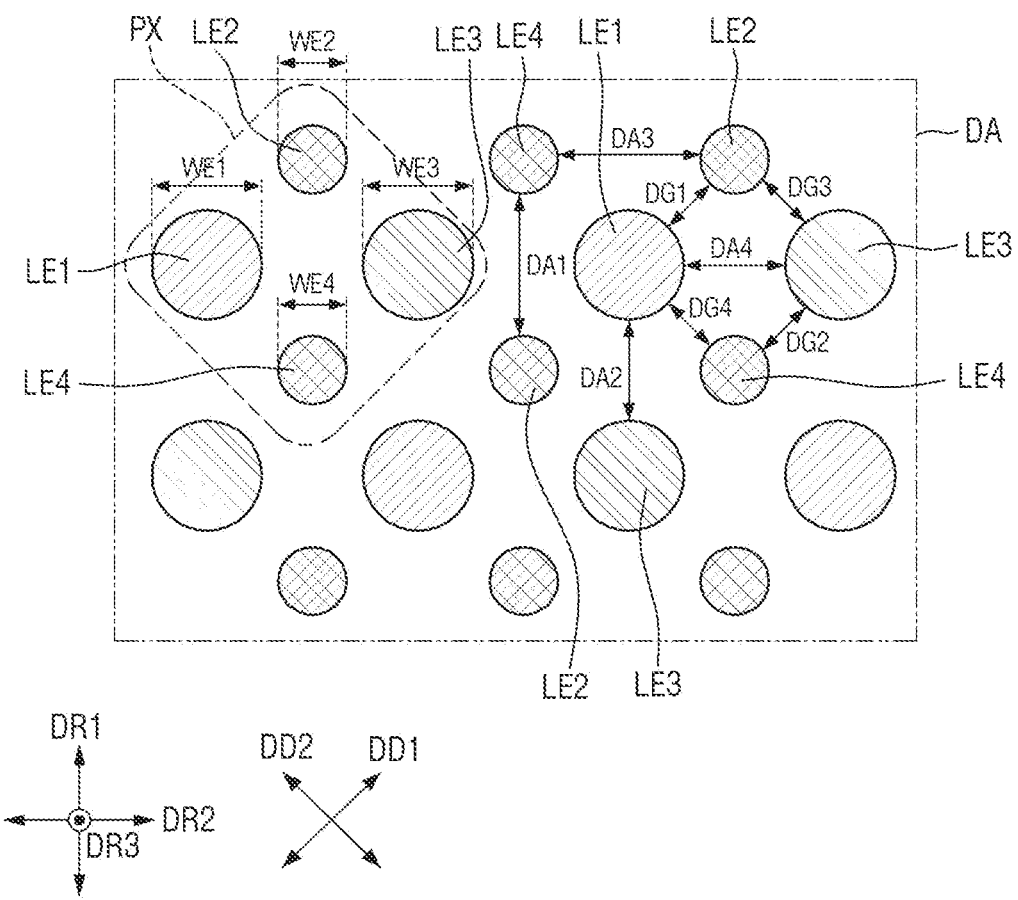
Figure 33:
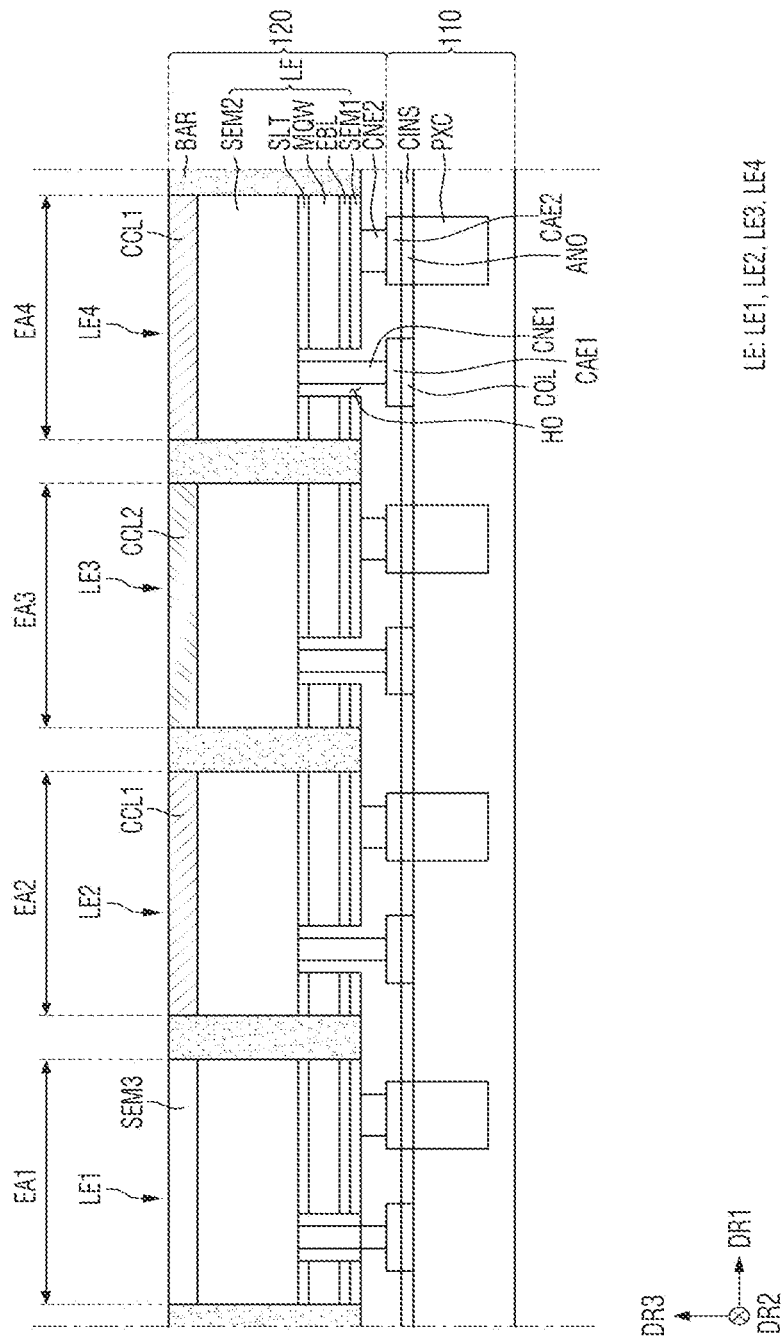
FIG. 33 is a cross-sectional view illustrating an example of the display panel taken along line D-D' of FIG. 28.

In some embodiments, referring to FIGS. 31 and 32, in a display device according to one or more embodiments, sizes of the respective light emitting elements LE1, LE2, LE3, and LE4 may be different from each other. In one or more embodiments of FIG. 31, a first diameter WE1 of a first light emitting element LE1 may be greater than each of diameters WE2, WE3, and WE4 of a second light emitting element LE2, a third light emitting element LE3, and a fourth light emitting element LE4, and a third diameter WE3 of the third light emitting element LE3 may be greater than the diameters WE2 and WE4 of the second light emitting element LE2 and the fourth light emitting element LE4. A second diameter WE2 of the second light emitting element LE2 may be the same as a fourth diameter WE4 of the fourth light emitting element LE4. The embodiments of FIG. 32 are different from the embodiments of FIG. 31 in that the first diameter WE1 of the first light emitting element LE1 is the same as the third diameter WE3 of the third light emitting element LE3.

In one or more embodiments, intervals between the light emitting elements LE adjacent to each other may be partially different from each other. For example, a first interval DA1 between the second light emitting element LE2 and the fourth light emitting element LE4 adjacent to each other in the first direction DR1 may be greater than a second interval DA2 between the first light emitting element LE1 and the third light emitting element LE3 adjacent to each other in the first direction DR1. A third interval DA3 between the second light emitting element LE2 and the fourth light emitting element LE4 adjacent to each other in the second direction DR2 may be greater than a fourth interval DA4 between the first light emitting element LE1 and the third light emitting element LE3 adjacent to each other in the second direction DR2. In some embodiments, a first diagonal interval DG1 between the first light emitting element LE1 and the second light emitting element LE2 adjacent to each other in the first diagonal direction DD1 may be different from a second diagonal interval DG2 between the third light emitting element LE3 and the fourth light emitting element LE4 adjacent to each other in the first diagonal direction DD1. A third diagonal interval DG3 between the second light emitting element LE2 and the third light emitting element LE3 adjacent to each other in the second diagonal direction DD2 may be different from a fourth diagonal interval DG4 between the first light emitting element LE1 and the fourth light emitting element LE4 adjacent to each other in the second diagonal direction DD2.

In one or more embodiments in which the first diameter WE1 of the first light emitting element LE1 is greater than the third diameter WE3 of the third light emitting element LE3, the first diagonal interval DG1 may be smaller than the second diagonal interval DG2, and the third diagonal interval DG3 may be greater than the fourth diagonal interval DG4. However, the present disclosure is not limited thereto. The intervals between the light emitting elements LE adjacent to each other may be changed depending on an arrangement, diameters, and/or the like, of the light emitting elements LE. For example, in embodiments in which the first diameter WE1 of the first light emitting element LE1 is the same as the third diameter WE3 of the third light emitting element LE3, the first diagonal interval DG1 may be the same as the second diagonal interval DG2, and the third diagonal interval DG3 may be the same as the fourth diagonal interval DG4.

In some embodiments, in FIGS. 31 and 32, intervals illustrated based on outer side portions (e.g., peripheral circumferences) of the light emitting elements LE1, LE2, LE3, and LE4 have been described as examples of the intervals DA1 to DA4 and DG1 to DG4 between the light emitting elements LE1, LE2, LE3, and LE4, but the present disclosure is not limited thereto. Similar to the embodiments of FIG. 30, the intervals between the light emitting elements LE1, LE2, LE3, and LE4 described in FIGS. 31 and 32 may be similarly applied (e.g., similarly related) even though the intervals between the light emitting elements LE1, LE2, LE3, and LE4 are compared with each other based on centers of the light emitting elements LE1, LE2, LE3, and LE4. However, in the embodiments in which the diameters of the respective light emitting elements LE1, LE2, LE3, and LE4 are different from each other, magnitude relationships between the intervals between the light emitting elements LE1, LE2, LE3, and LE4 based on the outer side portions of the light emitting elements LE1, LE2, LE3, and LE4 and the intervals between the light emitting elements LE1, LE2, LE3, and LE4 based on the centers of the light emitting elements LE1, LE2, LE3, and LE4 may be different from each other.

In some embodiments, the first emission area EA1 may emit the first light, the second emission area EA2 and the fourth emission area EA4 may emit the second light, and the third emission area EA3 may emit the third light, but one or more embodiments of the present disclosure is not limited thereto. For example, the first emission area EA1 may emit the first light, the second emission area EA2 and the fourth emission area EA4 may emit the third light, and the third emission area EA3 may emit the second light. In some embodiments, the first emission area EA1 may emit the second light, the second emission area EA2 and the fourth emission area EA4 may emit the first light, and the third emission area EA3 may emit the third light.

In some embodiments, the first emission area EA1, the second emission area EA2, the third emission area EA3, and the fourth emission area EA4 may have a circular shape in plan view, but one or more embodiments of the present disclosure is not limited thereto. For example, the first emission area EA1, the second emission area EA2, the third emission area EA3, and the fourth emission area EA4 may have a polygonal shape such as a triangular shape, a quadrangular shape, a pentagonal shape, a hexagonal shape, and/or an octagonal shape, an elliptical shape, and/or an irregular shape.

Figure 34:
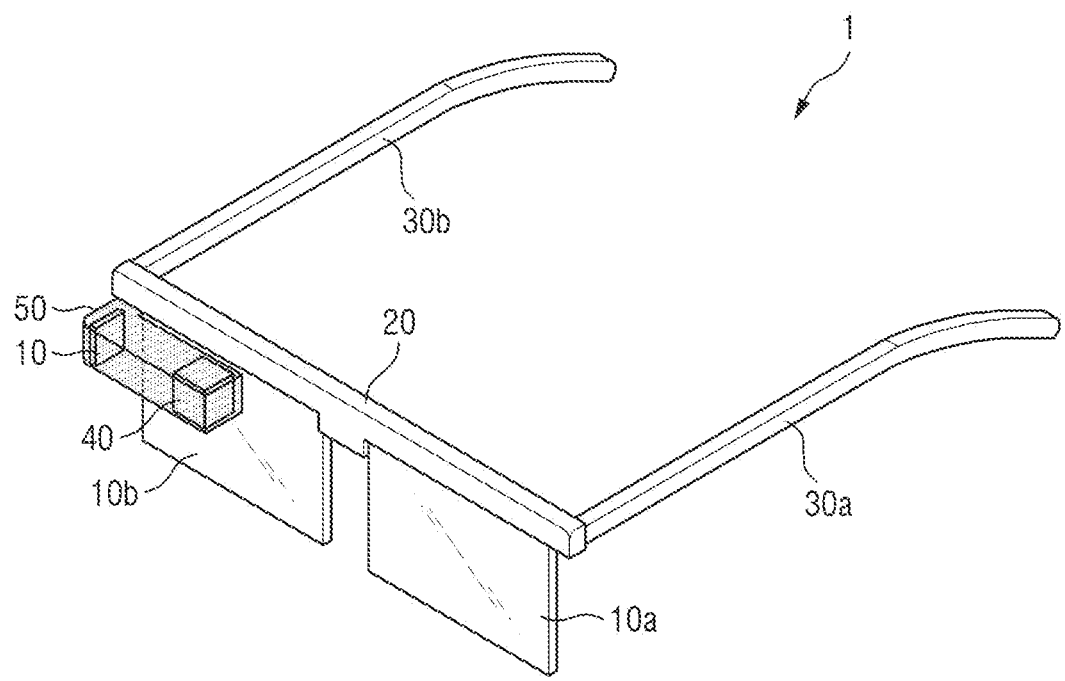
FIG. 34 is a perspective view illustrating a virtual reality device including the display device according to one or more embodiments.

FIG. 34 is a perspective view illustrating a virtual reality device including the display device according to one or more embodiments. A virtual reality device 1 to which the display device 10 according to one or more embodiments is applied is illustrated in FIG. 34.

Referring to FIG. 34, the virtual reality device 1 according to one or more embodiments may be a glasses-type (e.g., glasses-like) device. The virtual reality device 1 according to one or more embodiments may include the display device 1, a left eye lens 10a, a right eye lens 10b, a support frame 20, eyeglass frame legs 30a and 30b, a reflective member 40, and a display device accommodating part 50.

The virtual reality device 1 including the eyeglass frame legs 30a and 30b has been illustrated in FIG. 34, but the virtual reality device 1 according to one or more embodiments may also be applied to a head mounted display including a head mounted band that may be mounted on a user's head instead of the eyeglass frame legs 30a and 30b. For example, the virtual reality device 1 according to one or more embodiments is not limited to that illustrated in FIG. 34, and may be applied in various suitable forms to various other suitable electronic devices.

The display device accommodating part 50 may include the display device 10 and the reflective member 40. An image displayed on the display device 10 may be reflected by the reflective member 40 and provided to a user's right eye through the right eye lens 10b. Accordingly, a user may view a virtual reality image displayed on the display device 10 through the user's right eye.

It has been illustrated in FIG. 34 that the display device accommodating part 50 is provided at a right end of the support frame 20, but one or more embodiments of the present disclosure is not limited thereto. For example, the display device accommodating part 50 may be provided at a left end of the support frame 20. In this case, an image displayed on the display device 10 may be reflected by the reflective member 40 and provided to a user's left eye through the left eye lens 10a. Accordingly, the user may view a virtual reality image displayed on the display device 10 through the user's left eye. In some embodiments, the display device accommodating parts 50 may be provided at both the left and right ends of the support frame 20. In this case, the user may view a virtual reality image displayed on the display device 10 through both of the user's left and right eyes.

Figure 35:
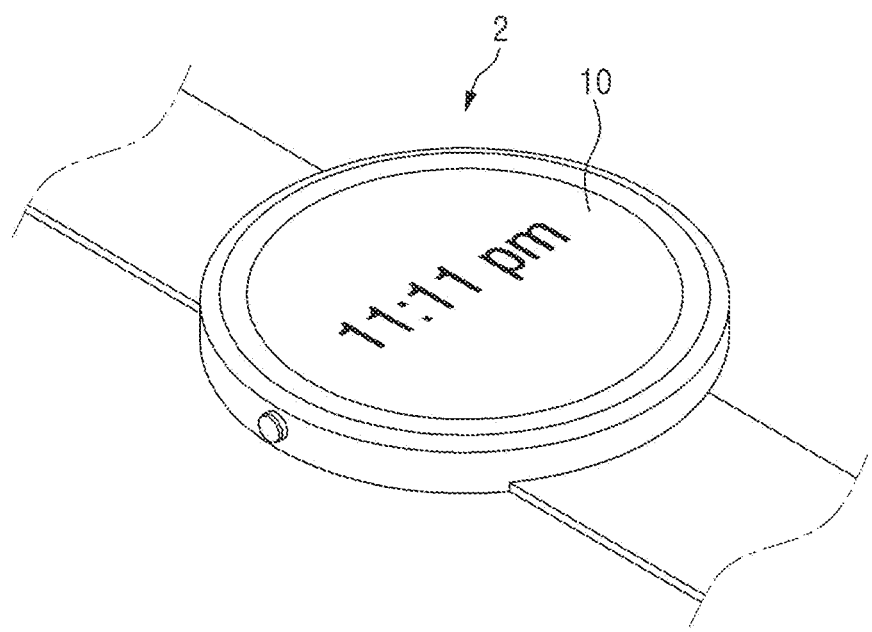
FIG. 35 is a perspective view illustrating a smart device including the display device according to one or more embodiments.

FIG. 35 is a perspective view illustrating a smart device including the display device according to one or more embodiments.

Referring to FIG. 35, the display device 10 according to one or more embodiments may be applied to a smart watch 2, which is one of the smart devices.

Figure 36:
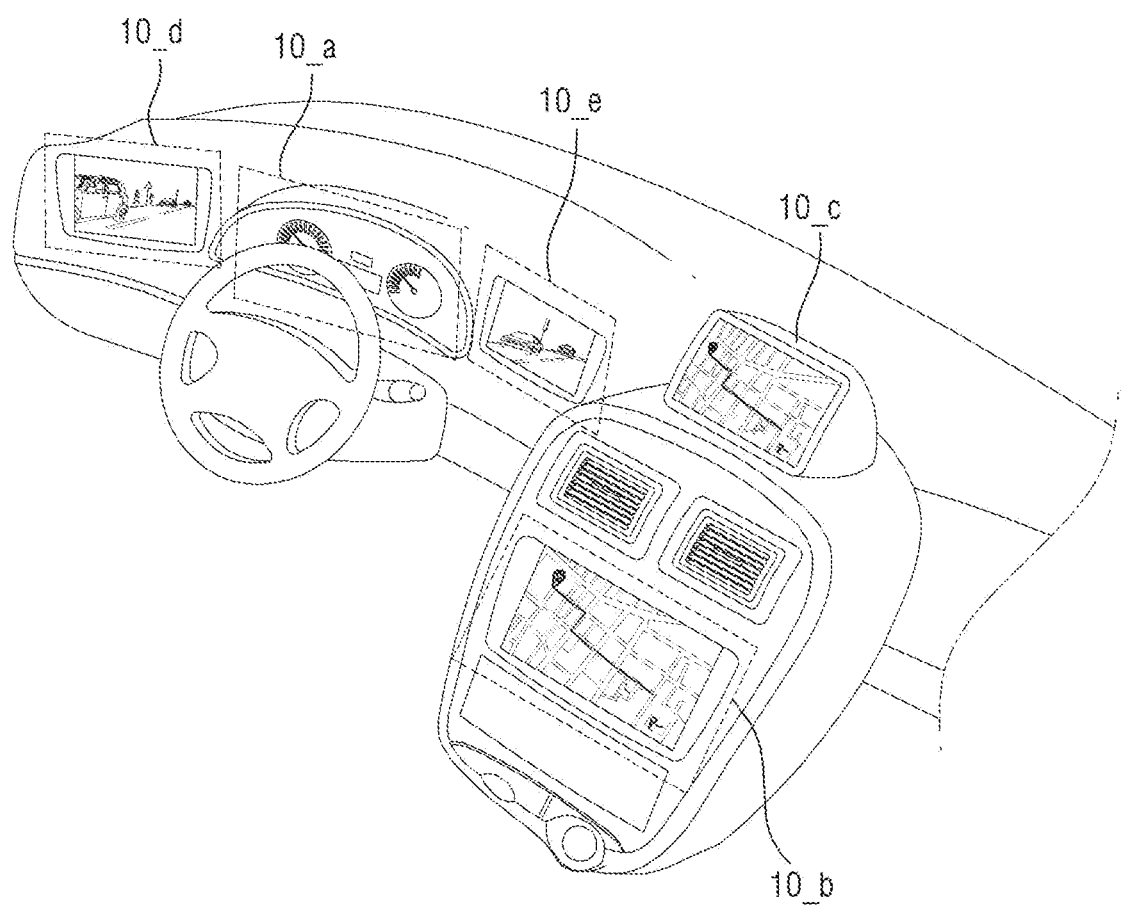
FIG. 36 is a perspective view illustrating a vehicle including the display device according to one or more embodiments.

FIG. 36 is a perspective view illustrating a vehicle including the display device according to one or more embodiments. A vehicle to which the display device according to one or more embodiments is applied is illustrated in FIG. 36.

Referring to FIG. 36, display devices 10_a, 10_b, and 10_c according to one or more embodiments may be applied to an instrument board of the vehicle, applied to a center fascia of the vehicle, and/or applied to a center information display (CID) provided on a dashboard of the vehicle. In some embodiments, display devices 10_d and 10_e according to one or more embodiments may be applied to room mirror displays substituting for side mirrors of the vehicle.

Figure 37:
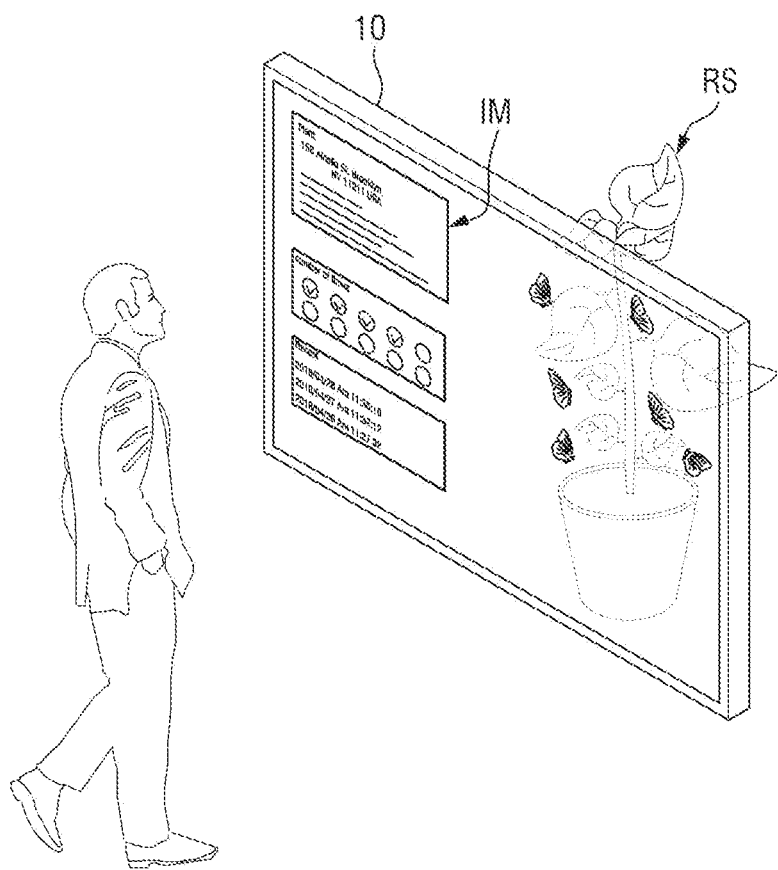
FIG. 37 is a perspective view illustrating a transparent display device including the display device according to one or more embodiments.

FIG. 37 is a perspective view illustrating a transparent display device including the display device according to one or more embodiments.

Referring to FIG. 37, the display device 10 according to one or more embodiments may be applied to a transparent display device. The transparent display device may transmit light therethrough while displaying an image IM. Therefore, a user positioned on (at) a front surface of the transparent display device may not only view the image IM displayed on the display device 10, but also see an object RS or a background positioned on a rear surface of the transparent display device. When the display device 10 is applied to the transparent display device, the semiconductor circuit substrate 110 of the display device 10 illustrated in FIG. 4 may include a light transmitting part capable of transmitting light or may be made of a material capable of transmitting light.

In concluding the detailed description, those skilled in the art will appreciate that many variations and modifications can be made to the present embodiments without substantially departing from the principles of the present disclosure as set forth in the following claims and their equivalents. Therefore, the disclosed embodiments are used in a generic and descriptive sense only and not for purposes of limitation.

What is claimed is:

1. A display device comprising:
a substrate;
a first light emitting element, a second light emitting element, and a third light emitting element on the substrate, the first light emitting element, the second light emitting element, and the third light emitting element each including a first semiconductor layer, an active layer, and a second semiconductor layer;
a third semiconductor layer on the first light emitting element;
a first color conversion layer on the second light emitting element; and
a second color conversion layer on the third light emitting element,
wherein the first color conversion layer and the second color conversion layer comprise the same semiconductor material as the third semiconductor layer, and each further comprise a dopant different from a dopant comprised in the second semiconductor layer.

2. The display device of claim 1, wherein a semiconductor material of each of the first color conversion layer and the second color conversion layer is any one of AlGaInN, GaN, AlGaN, InGaN, AlN, or InN.

3. The display device of claim 1, wherein the dopant of the first color conversion layer is erbium (Er) and the dopant of the second color conversion layer is europium (Eu).

4. The display device of claim 1, wherein the first color conversion layer comprises GaN doped with erbium (Er), and the second color conversion layer comprises GaN doped with europium (Eu).

5. The display device of claim 1, wherein each of the first color conversion layer and the second color conversion layer has a thickness of 50 nm to 1000 nm.

6. The display device of claim 1, wherein each of the first light emitting element, the second light emitting element, and the third light emitting element is configured to emit a light of a blue wavelength band.

7. The display device of claim 6, wherein the first color conversion layer is configured to convert the light of the blue wavelength band into a light of a green wavelength band and to emit the light of the green wavelength band, and the second color conversion layer is configured to convert the light of the blue wavelength band into a light of a red wavelength band and to emit the light of the red wavelength band.

8. The display device of claim 1, further comprising:
a first connection electrode on the second semiconductor layer of each of the first light emitting element, the second light emitting element, and the third light emitting element; and
a second connection electrode on the first semiconductor layer of each of the first light emitting element, the second light emitting element, and the third light emitting element.

9. The display device of claim 8, wherein each of the first light emitting element, the second light emitting element, and the third light emitting element comprises a hole penetrating through the first semiconductor layer and the active layer to expose the second semiconductor layer, and
the first connection electrode is in contact with the second semiconductor layer through the hole.

10. The display device of claim 8, wherein the substrate comprises a plurality of pixel electrodes, a plurality of second contact electrodes on the plurality of pixel electrodes, a plurality of common lines, and a plurality of first contact electrodes on the plurality of common lines, and
the first connection electrode is connected to a corresponding first contact electrode of the plurality of first contact electrodes, and the second connection electrode is connected to a corresponding second contact electrode of the plurality of second contact electrodes.

11. The display device of claim 1, further comprising a barrier layer partitioning the first light emitting element, the second light emitting element, and the third light emitting element from each other while surrounding the first light emitting element, the second light emitting element, and the third light emitting element,
wherein an upper surface of the third semiconductor layer, an upper surface of the first color conversion layer, and an upper surface of the second color conversion layer are aligned and coincide with each other.

12. The display device of claim 1, wherein each of the first color conversion layer and the second color conversion layer has a single-layer or a multilayer structure, and
the multilayer structure comprises a plurality of first conversion layers and a plurality of second conversion layers that are alternately stacked, the plurality of first conversion layers comprising a semiconductor material doped with a dopant, and the plurality of second conversion layers comprising a semiconductor material.

13. A method for manufacturing a display device, the method comprising:
forming a first emission area, a second emission area, and a third emission area by forming a third semiconductor layer and a barrier layer on a target substrate;
further growing the third semiconductor layer in the first emission area, forming a first color conversion layer in the second emission area, and forming a second color conversion layer in the third emission area;
forming light emitting elements in the first emission area, the second emission area, and the third emission area, respectively;
forming holes by etching the light emitting elements;
forming connection electrodes on the light emitting elements; and
bonding the light emitting elements to a semiconductor circuit substrate, wherein the first color conversion layer is grown from the third semiconductor layer and is doped with erbium (Er) as a dopant, and the second color conversion layer is grown from the third semiconductor layer and is doped with europium (Eu) as a dopant.

14. The method for manufacturing a display device of claim 13, wherein the first color conversion layer and the second color conversion layer are grown by the third semiconductor layer acting as a seed, and reactive gases comprising the corresponding dopants flow to the first color conversion layer and the second color conversion layer.

15. The method for manufacturing a display device of claim 13, wherein the further growing of the third semiconductor layer in the first emission area, the forming of the first color conversion layer in the second emission area, and the forming of the second color conversion layer in the third emission area comprises:
- forming first insulating patterns in the second emission area and the third emission area and growing the third semiconductor layer in the first emission area;
- forming a second insulating pattern in the first emission area, removing the first insulating pattern of the second emission area, and then forming the first color conversion layer in the second emission area;
- forming a third insulating pattern on the first color conversion layer, removing the first insulating pattern of the third emission area, and then forming the second color conversion layer in the third emission area; and
- removing the second insulating pattern and the third insulating pattern.

16. The method for manufacturing a display device of claim 13, wherein in the forming of the light emitting elements, a second semiconductor layer, an active layer, and a first semiconductor layer are sequentially grown.

17. The method for manufacturing a display device of claim 16, wherein in the forming of the holes, the active layer and the first semiconductor layer are etched to expose the second semiconductor layer.

18. The method for manufacturing a display device of claim 16, further comprising, after the forming of the light emitting elements, forming first connection electrodes on the second semiconductor layers of the light emitting elements and forming second connection electrodes on the first semiconductor layers through the holes.

19. The method for manufacturing a display device of claim 18, wherein in the bonding of the light emitting elements to the semiconductor circuit substrate, contact electrodes on the semiconductor circuit substrate and the first connection electrodes and the second connection electrodes are fusion-bonded to each other.

20. A display device comprising:
- a substrate;
- a light emitting element on the substrate and comprising a first semiconductor layer, an active layer, and a second semiconductor layer;
- a barrier layer on the light emitting element and partitioning a first emission area, a second emission area and a third emission area to be spaced apart from each other;
- a third semiconductor layer overlapping the first emission area;
- a first color conversion layer overlapping the second emission area; and
- a second color conversion layer overlapping the third emission area,
- wherein the first color conversion layer comprises a semiconductor material doped with erbium (Er), and the second color conversion layer comprises a semiconductor material doped with europium (Eu).

* * * * *